(12) United States Patent  
Arai et al.

(10) Patent No.: US 6,552,429 B2  
(45) Date of Patent: Apr. 22, 2003

(54) POWER SWITCHING SEMICONDUCTOR DEVICE WITH SUPPRESSED OSCILLATION

(75) Inventors: Kiyoshi Arai, Chiyoda-ku (JP); Nobuhisa Honda, Fukuoka (JP); Hideo Matsumoto, Chiyoda-ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 53 days.

(21) Appl. No.: 09/939,746

(22) Filed: Aug. 28, 2001

(65) Prior Publication Data

US 2002/0024135 A1 Feb. 28, 2002

Related U.S. Application Data

(63) Continuation-in-part of application No. 09/796,518, filed on Mar. 2, 2001, now abandoned.

(30) Foreign Application Priority Data

Aug. 28, 2000 (JP) .................................. 2000-257227  
Jun. 19, 2001 (JP) .................................. 2001-184608

(51) Int. Cl.[7] .............................................. H01L 23/34
(52) U.S. Cl. .................... 257/723; 257/566; 257/573; 257/584; 257/593
(58) Field of Search ..................... 257/723, 566, 257/573, 584, 593

(56) References Cited

U.S. PATENT DOCUMENTS

| | | | | |
|---|---|---|---|---|
| 5,608,595 A | * | 3/1997 | Gourab et al. ............... 361/79 |
| 5,949,273 A | * | 9/1999 | Mourick et al. ............. 327/442 |
| 5,956,231 A | * | 9/1999 | Yamada et al. ............. 361/728 |
| 6,137,816 A | * | 10/2000 | Kinbara ..................... 372/38 |
| 6,204,717 B1 | * | 3/2001 | Nagasu et al. ............. 327/318 |

* cited by examiner

Primary Examiner—David Nelms  
Assistant Examiner—Tu-Tu Ho  
(74) Attorney, Agent, or Firm—Oblon, Spivak, McClelland, Maier & Neustadt, P.C.

(57) ABSTRACT

A wiring pattern (26) or (27) and conductor wires (W1, W2) or (W3, W4) not relaying a wiring pattern (22) or (23) fed with an emitter current connect emitter electrodes of a plurality of IGBTs (3) connected in parallel with each other. Thus, oscillation appearing on the potential of a control electrode of the plurality of IGBTs (3) is suppressed.

18 Claims, 24 Drawing Sheets

F I G. 8
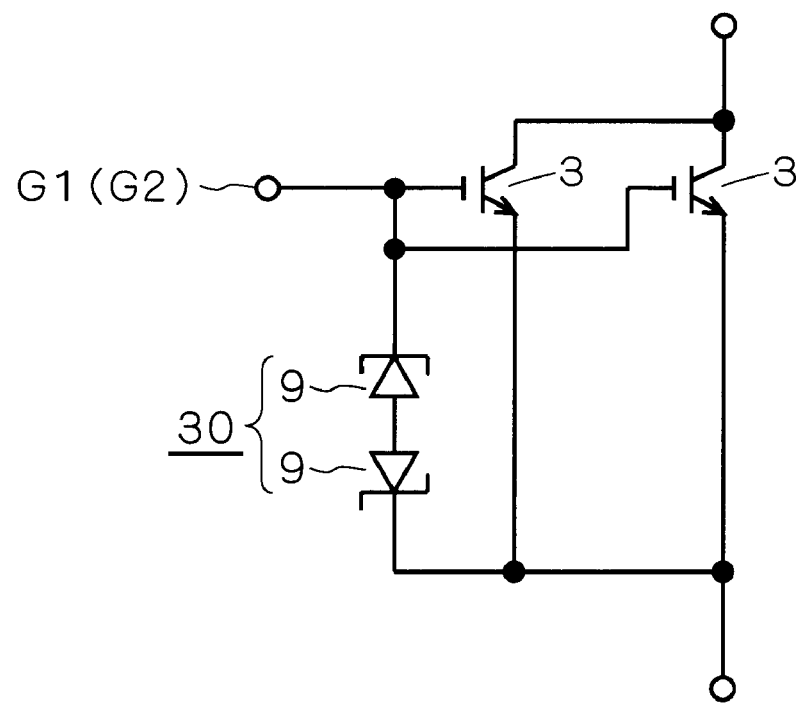

POWER SWITCHING SEMICONDUCTOR DEVICE WITH SUPPRESSED OSCILLATION

This application is a Continuation-in-part (CIP) of prior application Ser. No. 09/796,518 filed on Mar. 2, 2001, now abandoned.

BACKGROUND OF THE INVENTION

1. Field of the Invention

The present invention relates to a semiconductor device suitable for controlling a large current, and more particularly, it relates to an improvement for suppressing oscillation appearing on the potential of a control electrode of a switching element.

2. Description of the Background Art

FIG. 28 is a plan sectional view showing a base portion of a conventional semiconductor device 150 forming the background of the present invention. This semiconductor device 150 is formed as a power module comprising a plurality of power semiconductor elements. As shown in FIG. 28, the semiconductor device 150 comprises a substrate 62 on its bottom potion. A plurality of wiring patterns 81 to 85 isolated from each other are arranged on the main surface of the substrate 62 in the form of islands. Two IGBTs 63 and two diodes 64 belonging to an upper arm 70 are arranged on the wiring pattern 81, while two IGBTs 63 and two diodes 64 belonging to a lower arm 71 are arranged on the wiring pattern 82.

The four IGBTs 63 and the four diodes 64 are formed as bare chips. Thus, collector electrodes of the two IGBTs 63 and cathodes of the two diodes 64 belonging to the upper arm 70 are electrically connected with each other through the wiring pattern 81. Similarly, collector electrodes of the two IGBTs 63 and cathodes of the two diodes 64 belonging to the lower arm 71 are electrically connected with each other through the wiring pattern 82.

A number of conductor wires 75 connect emitter electrodes of the two IGBTs 63 belonging to the upper arm 70 with the wiring pattern 82. A number of conductor wires 76 connect anodes of the two diodes 64 belonging to the upper arm 70 with the wiring pattern 82. Similarly, a number of conductor wires 75 connect emitter electrodes of the two IGBTs 63 belonging to the lower arm 71 with the wiring pattern 83. Further, a number of conductor wires 76 connect anodes of the two diodes 64 belonging to the lower arm 71 with the wiring pattern 83.

FIG. 28 omits illustration of the conductor wires 75 as the upper arm 70 while omitting illustration of the conductor wires 76 as to the lower arm 71, in order to avoid complication.

Conductor wires 77 connect the wiring pattern 84 with gate electrodes of the two IGBTs 63 belonging to the upper arm 70. Similarly, conductor wires 77 connect the wiring pattern 85 with gate electrodes of the two IGBTs 63 belonging to the lower arm 71.

An external terminal CC supplied with a high power supply potential, an external terminal EE supplied with a low power supply potential, an external terminal OUT connected with a load and external terminals G1, G2, S1 and S2 connected with drive circuits are connected to the wiring patterns 81 to 85. FIG. 16 shows connection parts between the wiring patterns 81 to 85 and the external terminals CC, EE, OUT, G1, G2, S1 and S2 with hatching.

In the semiconductor device 150, as hereinabove described, the serially connected upper and lower arms 70 and 71 are interposed between the high power supply potential and the low power supply potential so that the two IGBTs 63 belonging to the upper arm 70 (and the lower arm 71) are turned on/off in response to a drive signal input in the external terminal G1 (and G2).

As shown in the example of the semiconductor device 150, a plurality of power switching elements are connected in parallel with each other in a power module having a large rated current of at least 100 A, for example, in order to share the large current. When unexpected short-circuiting is caused on a load, however, a short-circuit current of about five to 10 times the rated current flows in the power module. In the power module comprising a plurality of power switching elements, the potential of a control electrode (gate electrode in an IGBT) of each switching element may oscillate when such a short-circuit current flows. Such a tendency is recognized that oscillation readily takes place as the rated current of the power module is increased.

Moreover, even in the case when only one switching element is installed on each of the upper arm and lower arm, if the main electrode of a switching element has a plurality of bonding pads (a plurality of belt shape portions indicated in the IGBT 63 in FIG. 28) divided into respective sections, the same oscillation tends to occur in the event of a short-circuiting current flowing through it.

Such oscillation may influence normal operation of an applied apparatus utilizing the power module, or cause noise. If the switching element is an IGBT, further, influence on a gate insulator film is also supposed.

SUMMARY OF THE INVENTION

Thus, an object of the present invention is to provide a semiconductor device capable of suppressing oscillation appearing on the potential of a control electrode of a switching element.

According to a first aspect of the present invention, a semiconductor device comprises a substrate having a main surface, a first wiring pattern arranged on the main surface, a plurality of switching elements arranged on the first wiring pattern so that first main electrodes thereof are electrically connected with each other, a second wiring pattern arranged on the main surface, a plurality of first conductor wires having first ends connected to second main electrodes of the plurality of switching elements and second ends connected to the second wiring pattern, an external terminal connected to the second wiring pattern for electrically connecting the second main electrodes of the plurality of switching elements with the exterior through the second wiring pattern and a conductor electrically connecting the second main electrodes of the plurality of switching elements with each other without through the second wiring pattern.

In the semiconductor device according to the first aspect, the second main electrodes of the plurality of switching elements connected in parallel with each other are electrically connected with each other through the conductor not relaying the second wiring pattern, i.e., the conductor not fed with a main current, whereby the potentials of the second main electrodes are uniformized between the plurality of switching elements. Consequently, the potentials of control electrodes of the plurality of switching elements are inhibited from oscillation also when a load on the plurality of switching elements is short-circuited.

According to a second aspect of the present invention, the conductor includes a third wiring pattern arranged on the main surface isolatedly from the second wiring pattern and a plurality of second conductor wires having first ends connected to the second main electrodes of the plurality of switching elements and second ends connected to the third wiring pattern.

In the semiconductor device according to the second aspect, electrical connection between the second main electrodes of the plurality of switching elements is readily implemented through the third wiring pattern and the second conductor wires. Further, no wire cutting may be performed on the switching elements in a step of arranging the second conductor wires, to require no means for preventing damage of the switching elements.

According to a third aspect of the present invention, the second wiring pattern extends along the direction of arrangement of the plurality of switching elements, and the third wiring pattern extends along the direction of arrangement of the plurality of switching elements on the side opposite to the second wiring pattern through the plurality of switching elements.

In the semiconductor device according to the third aspect, the second and third wiring patterns are arranged on opposite sides of the plurality of switching elements and extend along the direction of arrangement of the plurality of switching elements, whereby the first and second conductor wires can be readily arranged without interfering with each other. Further, inductive coupling between the first and second conductor wires can be reduced thereby improving the effect of suppressing oscillation.

According to a fourth aspect of the present invention, the third wiring pattern is adjacent to the plurality of switching elements without through the remaining wiring patterns interposed therebetween.

In the semiconductor device according to the fourth aspect, the third wiring pattern is adjacent to the plurality of switching elements without the remaining wiring patterns interposed therebetween, whereby the second conductive wires can be set short. Thus, the inductance of the conductor electrically connecting the second main electrodes of the plurality of switching elements is reduced, whereby the effect of uniformizing the potentials of the second main electrodes can be improved.

According to a fifth aspect of the present invention, the third wiring pattern has a repetitive bent portion.

In the semiconductor device according to the fifth aspect, the third wiring pattern has the repetitive bent potion, whereby the inductance of the conductor electrically connecting the second main electrodes of the plurality of switching elements can be adjusted to a value optimum for suppressing oscillation.

According to a sixth aspect of the present invention, the conductor includes a third conductor wire directly connecting the second main electrodes of the plurality of switching elements with each other.

In the semiconductor device according to the sixth aspect, the third conductor wire directly connects the second main electrodes of the plurality of switching elements with each other, whereby steps of manufacturing the semiconductor device are simplified and the semiconductor device can be miniaturized.

According to a seventh aspect of the present invention, the second wiring pattern extends along the direction of arrangement of the plurality of switching elements, the plurality of first conductor wires are arranged in a direction substantially perpendicular to the direction of arrangement, and the third conductor wire is arranged along the direction of arrangement.

In the semiconductor device according to the seventh aspect, the first and third conductor wires are arranged to be substantially orthogonal to each other so that inductive coupling therebetween is suppressed, thereby improving the effect of suppressing oscillation.

According to an eighth aspect of the present invention, the third conductor wire is connected with the second main electrodes of the plurality of switching elements on portions farther from the second wiring pattern than the first ends of the plurality of first conductor wires.

In the semiconductor device according to the eighth aspect, the third conductor wire is connected to the second main electrodes of the plurality of switching elements on the portions farther from the second wiring pattern than the first ends of the plurality of first conductor wires, whereby inductive coupling between the first and third conductor wires is further suppressed thereby further improving the effect of suppressing oscillation. In addition, the first and second conductor wires can be readily arranged without interfering with each other.

According to a ninth aspect of the present invention, the semiconductor device further comprises a fourth wiring pattern arranged on the main surface, a plurality of fourth conductor wires having first ends connected to control electrodes of the plurality of switching elements and second ends connected to the fourth wiring pattern and a voltage clamping element having a first end connected to the third wiring pattern and a second end connected to the fourth wiring pattern.

In the semiconductor device according to the ninth aspect, the voltage clamping element is interposed between the control electrodes of the plurality of switching elements and the third wiring pattern. Even if the potentials of the control electrodes oscillate, therefore, amplitudes thereof are suppressed.

According to a tenth aspect of the present invention, a semiconductor device comprises a substrate having a main surface, a first wiring pattern arranged on the main surface, a plurality of switching elements arranged on the first wiring pattern so that first main electrodes thereof are electrically connected with each other, a second wiring pattern arranged on the main surface, a plurality of first conductor wires having first ends connected to second main electrodes of the plurality of switching elements and second ends connected to the second wiring pattern, an external terminal connected to the second wiring pattern for electrically connecting the second main electrodes of the plurality of switching elements with the exterior through the second wiring pattern and a voltage clamping element electrically connected between control electrodes and the second main electrodes of the plurality of switching elements.

In the semiconductor device according to the tenth aspect, the voltage clamping element is interposed between the control electrodes and the second main electrodes of the plurality of switching elements, thereby suppressing amplitudes of oscillation.

According to an eleventh aspect of the present invention, a semiconductor device comprises a substrate having a main surface, a first wiring pattern arranged on the main surface, a plurality of switching elements arranged on the first wiring pattern so that first main electrodes thereof are electrically connected with each other, a second wiring pattern arranged on the main surface to extend along the direction of arrangement of the plurality of switching elements, a plurality of first conductor wires having first ends connected to second main electrodes of the plurality of switching elements and second ends connected to the second wiring pattern, an external terminal connected to the second wiring pattern for electrically connecting the second main electrodes of the plurality of switching elements with the exterior through the second wiring pattern, a plurality of diodes, provided in the same number as the plurality of switching elements, arranged on the first wiring pattern so that first electrodes thereof are electrically connected with each other and arranged between the plurality of switching elements and the second wiring pattern to be adjacent to the plurality of switching elements in one-to-one correspondence, a plurality of second conductor wires having first ends connected to second electrodes of the plurality of diodes and second ends connected to the second wiring pattern and a plurality of third conductor wires having first ends connected to the second main electrodes of the plurality of switching elements, intermediate potions connected to the second electrodes of at least part of the plurality of diodes and second ends connected to the second wiring pattern thereby electrically connecting all second main electrodes of the plurality of switching elements with each other without through the second wiring pattern.

In the semiconductor device according to the eleventh aspect, the second main electrodes of the plurality of switching elements are electrically connected with each other through the third conductor wires and the second electrodes of the diodes without through the second wiring pattern. Thus, the potentials of the second main electrodes are uniformized between the plurality of switching elements, whereby the potentials of the control electrodes are inhibited from oscillation also when a load is short-circuited. Further, the second ends of the third conductor wires are connected to the second wiring pattern, whereby no wire cutting may be performed on the switching elements or on the diodes in a step of arranging the third conductor wires. Therefore, no means is required for preventing damage of the switching elements and the diodes in manufacturing steps.

According to a twelfth aspect of the present invention, the second wiring pattern extends along the direction of arrangement of the plurality of switching elements, the second wiring pattern is formed with a slit extending along the direction of arrangement so as to leave a coupling portion on the side of a first end of the direction of arrangement while as to leave no coupling portion on the side of a second end, the second ends of the plurality of first conductor wires are connected to the second wiring pattern on a first portion closer to the plurality of switching elements than the slit, and the external terminal is connected to the second wiring pattern on the coupling portion on the side of the first end, while the semiconductor device further comprises another external terminal connected to the second wiring pattern on the side of the second end in a second portion farther from the plurality of switching elements than the slit for electrically connecting the second main electrodes of the plurality of switching elements with the exterior through the second wiring pattern.

In the semiconductor device according to the twelfth aspect, the second wiring pattern extends along the direction of arrangement of the plurality of switching elements and has the slit extending along the direction of arrangement so as to leave the coupling portion on the side of the first end of the direction of arrangement while as to leave no coupling portion on the side of the second end, the second ends of the plurality of first conductor wires are connected to the first portion, the external terminal is connected on the coupling portion on the side of the first end, and the other external terminal is connected to the side of the second end of the second portion. When employing the other external terminal as a terminal supplying a reference potential for the potentials of the control electrodes, therefore, a main current is inhibited from abrupt increase, due to a feedback action resulting from the inductance of the first portion. Consequently, the potentials of the control electrodes are more effectively inhibited from oscillation.

According to a thirteenth aspect of the present invention, a semiconductor device comprises a substrate having a main surface, a first wiring pattern arranged on the main surface, a plurality of switching elements arranged on the first wiring pattern so that first main electrodes thereof are connected with each other, a second wiring pattern arranged on the main surface to extend along the direction of arrangement of the plurality of switching elements and formed with a slit extending along the direction of arrangement so as to leave a coupling portion on the side of a first end of the direction of arrangement while as to leave no coupling portion on the side of a second end, a plurality of first conductor wires having first ends connected to second main electrodes of the plurality of switching elements and second ends connected to the second wiring pattern on a first portion closer to the plurality of switching elements than the slit, an external terminal connected to the second wring pattern on the coupling portion on the side of the first end for electrically connecting the second main electrodes of the plurality of switching elements with the exterior through the second wiring pattern and another external terminal connected to the second wiring pattern on the side of the second end in a second portion farther from the plurality of switching elements than the slit for electrically connecting the second main electrodes of the plurality of switching elements with the exterior through the second wiring pattern.

In the semiconductor device according to the thirteenth aspect, the second wiring pattern extends along the direction of arrangement of the plurality of switching elements and has the slit extending along the direction of arrangement as to leave the coupling portion on the side of the first end of the direction of arrangement while as to leave no coupling portion on the side of the second end, the second ends of the plurality of first conductor wires are connected to the first portion, the external terminal is connected to the coupling portion on the side of the first end, and the other external terminal is connected to the side of the second end of the second portion. When employing the other external terminal as a terminal supplying a reference potential for the potentials of the control electrodes, therefore, a main current is inhibited from abrupt increase, due to a feedback action resulting from the inductance of the first portion. Consequently, the potentials of the control electrodes are more effectively inhibited from oscillation.

According to a fourteenth aspect of the present invention, the semiconductor device further comprises a fifth conductor wire having a first end connected to the first portion and a second end connected to the second portion.

The semiconductor device according to the fourteenth aspect comprises the fifth conductor connecting the first and second portions with each other, whereby the strength of the feedback action can be finely adjusted to be uniform among the individuals of the products by controlling the position for connecting the fifth conductor wire in the final stage of steps of manufacturing the semiconductor device.

According to a fifteenth aspect of the present invention, each of the plurality of switching elements is an insulated gate switching element.

In the semiconductor device according to the fifteenth aspect, the plurality of switching elements are inhibited from oscillation although each switching element is a readily oscillating insulated gate switching element, whereby the semiconductor device can be widely applied to apparatus controlling a large current through the advantage of the insulated gate switching element easy to control.

According to a sixteenth aspect of the present invention, the semiconductor device is provided with: a substrate having a main surface; a first wiring pattern arranged on the main surface; a switching element arranged on the first wiring pattern so that a first main electrode is electrically connected to the first wiring pattern with a second main electrode being provided with a plurality of bonding pads that are divided by control electrode wires; a second wiring pattern arranged on the main surface; a plurality of first conductor wires having first ends connected to the plurality of bonding pads with second ends being connected to the second wiring pattern; an external terminal, connected to the second wiring pattern, and configured to electrically connect the second main electrode of the switching element with the exterior through the second wiring pattern; a third wiring pattern arranged on the main surface in a manner so as to be isolated from the second wiring pattern; and not less than two conductor wires having first ends connected to not less than two bonding pads among the plurality of bonding pads, with second ends being connected to the third wiring pattern.

In the device according to the sixteenth aspect of the present invention, not less than two bonding pads among the plurality of bonding pads divided into respective sections are electrically connected to each other through not less than two second conductor wires and a third wiring pattern that are conductors that do not pass through a second wiring pattern, that is, conductors through which no main current flows; therefore, electric potentials are uniformed among the plurality of bonding pads. Consequently, even when the load of the switching element causes short circuiting, it is possible to suppress the oscillation in the electric potential of the control electrode of a switching element.

In accordance with a seventeenth aspect of the present invention, which relates to the semiconductor device of the sixteenth aspect of the present invention, the semiconductor device has an arrangement in which: the switching element is divided into a plurality of unit switching elements, each unit having an identical construction, each of the plurality of unit switching elements has at least two of the plurality of bonding pads, and the first ends of the not less than two second conductor wires are connected to not less than two of the at least two bonding pads with respect to each of the plurality of unit switching elements.

In the device according to the seventeenth aspect of the present invention, the switching element is divided into a plurality of unit switching elements, each having an identical construction; therefore, it is possible to increase the current capacity while reducing the size of the unit switching element. Moreover, not less than two bonding pads among the plurality of bonding pads belonging to each unit switching element are connected to each other through not less than two second conductor wires and a third wiring pattern, and the same connection is made between the plurality of unit switching elements. For this reason, it is possible to effectively suppress the oscillation of each unit switching element while maintaining the current capacity high.

In accordance with an eighteenth aspect of the present invention, which relates to the sixteenth or seventeenth aspect of the present invention, the semiconductor device has an arrangement in which the first ends of the not less than two second conductor wires are connected to all the plurality of bonding pads.

In the device according to the eighteenth aspect of the present invention, ends of the second conductor wires are connected to all the plurality of bonding pads; therefore, it is possible to further increase the suppressing effect for oscillation.

In accordance with a nineteenth aspect of the present invention, which relates to the sixteenth aspect of the present invention, the semiconductor device has an arrangement in which: the plurality of bonding pads are aligned along one direction, with the switching element being divided into a plurality of unit switching elements, each having an identical construction, and aligned along the one direction; each of the plurality of unit switching elements being provided with at least two of the plurality of bonding pads; and the first ends of the not less than two second conductor wires are connected to at least one bonding pad located at a position closest to adjacent another one unit switching element, with respect to each of the plurality of unit switching elements.

In the device according to the nineteenth aspect of the present invention, the bonding pads that are closest to each other between the adjacent unit switching elements are mutually connected electrically through not less than two second conductor wires and a third wiring pattern; therefore, it is possible to suppress the oscillation in each unit switching element. Moreover, since the third wiring pattern can be set to have narrow gaps, it is possible to miniaturize the device.

According to a twentieth aspect of the present invention, the semiconductor device is provided with: a substrate having a main surface; a first wiring pattern arranged on the main surface; a switching element arranged on the first wiring pattern so that a first main electrode is electrically connected to the first wiring pattern with a second main electrode being provided with a plurality of bonding pads that are divided by control electrode wires; a second wiring pattern arranged on the main surface; a plurality of first conductor wires having first ends connected to the plurality of bonding pads with second ends being connected to the second wiring pattern; an external terminal, connected to the second wiring pattern, and configured to electrically connect the second main electrode of the switching element with the exterior through the second wiring pattern; and a second conductor wire connecting not less than two bonding pads to each other among the plurality of bonding pads.

In the device according to the twentieth aspect of the present invention, not less than two bonding pads among the plurality of bonding pads divided into respective sections are electrically connected to each other through second conductor wires that are conductors that do not pass through a second wiring pattern, that is, conductors through which no main current flows; therefore, electric potentials are uniformed among the plurality of bonding pads. Consequently, even when the load of the switching element causes short circuiting, it is possible to suppress the oscillation in the electric potential of the control electrode of a switching element.

In accordance with a twenty-first aspect of the present invention, which relates to the twentieth aspect of the present invention, the semiconductor device has an arrangement in which: the switching element is divided into a plurality of unit switching elements, each unit having an identical construction; each of the plurality of unit switching elements has at least two of the plurality of bonding pads; and the second wire connects not less than two bonding pads of the at least two bonding pads to each other with respect to each of the plurality of unit switching elements, and connects respective bonding pads belonging to the plurality of unit switching elements to each other.

In the device according to the twenty-first aspect of the present invention, the switching element is divided into a plurality of unit switching elements, each having an identical construction; therefore, it is possible to increase the current capacity while reducing the size of the unit switching element. Moreover, not less than two bonding pads among the plurality of bonding pads belonging to each unit switching element are connected to each other through second conductor wires, and the same connection is made between the plurality of unit switching elements. For this reason, it is possible to effectively suppress the oscillation of each unit switching element while maintaining the current capacity high.

In accordance with a twenty-second aspect of the present invention, which relates to the twentieth aspect or twenty-first aspect of the present invention, the semiconductor device has an arrangement in which: the second conductor wire connects all the plurality of bonding pads to one after another.

In the device according to the twenty-second aspect of the present invention, one end of the second conductor wire is connected to all the plurality of bonding pads; therefore, it is possible to further increase the suppressing effect for oscillation.

According to a twenty-third aspect of the present invention, the semiconductor device is provided with: a substrate having a main surface; a first wiring pattern arranged on the main surface; a switching element arranged on the first wiring pattern so that a first main electrode is electrically connected to the first wiring pattern with a second main electrode being provided with a plurality of bonding pads that are divided by control electrode wires; a second wiring pattern arranged on the main surface; a plurality of first conductor wires having first ends connected to the plurality of bonding pads with second ends being connected to the second wiring pattern, the plurality of first conductor wires having one-to-one correspondence to the plurality of bonding pads; and an external terminal, connected to the second wiring pattern, and configured to electrically connect the second main electrode of the switching element with the exterior through the second wiring pattern, and in this arrangement, the plurality of bonding pads and the second wiring pattern are connected to each other by using only the plurality of first conductor wires.

In the device according to the twenty-third aspect of the present invention, each of the plurality of bonding pads divided into respective sections is electrically connected to a second wiring pattern through only one of the plurality of first conductor wires. For this reason, even when the load of the switching element causes short circuiting, the magnitude of the main current flowing through the switching element is limited by the resistance of the plurality of the first conductor wires, thereby making it to suppress he oscillation in the electric potential of the control electrode.

In accordance with a twenty-fourth aspect of the present invention, which relates to the twenty-third aspect of the present invention, the semiconductor device is further provided with: a diode that is placed on the first wiring pattern so that a first electrode is electrically connected to the first main electrode of the switching element, the diode being placed between the switching element and the second wiring pattern, and in this arrangement, a mid portion of each of the plurality of first conductor wires is connected to a second electrode of the diode.

In the device according to the twenty-fourth aspect of the present invention, since the mid portion of each of the plurality of the first conductor wires is connected to the second electrode of the diode, it is not necessary to install a conductor wire for connecting the switching element and the diode in a separated manner. In other words, it is possible to reduce the number of conductor wires in the entire device, and consequently to reduce the number of production processes and the production costs.

In accordance with a twenty-fifth aspect of the present invention, which relates to any one of the sixteenth to eighteenth aspects of the present invention, the semiconductor device has an arrangement in which the plurality of bonding pads are aligned along one direction, the second pattern is extended along the one direction, and the third wiring pattern is extended along the one direction on a side opposite to the second wiring pattern with the switching element interpolated in between.

In the device according to the twenty-fifth aspect of the present invention, the second and third wiring patterns are placed on the sides opposite to each other with the switching element interpolated in between, and are extended along the aligning direction of the plurality of bonding pads; therefore, it is possible to assemble the first and second conductor wires without causing any interference against each other. Moreover, it is possible to reduce the inductive coupling between the first conductor wires and the second conductor wires, and consequently to improve the effect for suppressing the oscillation.

In accordance with a twenty-sixth aspect of the present invention, which relates to the twenty-fifth aspect of the present invention, the semiconductor device has an arrangement in which the third wiring pattern is adjacent to the switching element without any wiring pattern interpolated in between.

In the device according to the twenty-sixth aspect of the present invention, the third wiring pattern is made adjacent to the switching element without having any wiring pattern interpolated in between; therefore, it is possible to shorten the second conductor wires. Thus, it is possible to reduce the inductance of conductors for electrically connecting the plurality of bonding pads, and consequently to improve the effect for uniforming electric potentials among the plurality of the bonding pads.

In accordance with a twenty-seventh aspect of the present invention, which relates to any one of the twentieth to twenty-second aspects of the present invention, the semiconductor device has an arrangement in which the plurality of bonding pads are aligned along one direction, the second wiring pattern is extended along the one direction, the plurality of first conductor wires are placed in a direction virtually orthogonal to the one direction, and the second conductor wire is placed along the one direction.

In the device according to the twenty-seventh aspect of the present invention, since the first conductor wires and the second conductor wires are placed virtually orthogonal to each other, it is possible to reduce the inductive coupling between them, and consequently to improve the effect for suppressing the oscillation.

In accordance with a twenty-eighth aspect of the present invention, which relates to the twenty-seventh aspect of the present invention, the semiconductor device has an arrangement in which the second conductor wire is connected to the second main electrode of the switching element at a portion farther from the second wiring pattern than the first ends of the plurality of first conductor wires.

In the device according to the twenty-eighth aspect of the present invention, the third conductor wire is connected to the second main electrode of the switching element at a portion farther from the second wiring pattern than the first ends of the plurality of first conductor wires; therefore, it is possible to further reduce the inductive coupling between the first conductor wires and the second conductor wire, and consequently to further improve the effects for suppressing the oscillation. Moreover, it is possible to easily assemble the first conductor wires and the second conductor wire without causing any interference against each other.

In accordance with a twenty-ninth aspect of the present invention, which relates to the twenty-third or twenty-fourth aspect of the present invention, the semiconductor device has an arrangement in which: the plurality of bonding pads are aligned along one direction, and the second wiring pattern is extended along the one direction.

In the device according to the twenty-ninth aspect of the present invention, since the second wiring pattern is extended along the aligning direction of the plurality of the bonding pads, it is possible to easily assemble the plurality of first conductor wires without causing any interference against each other.

In accordance with a thirtieth aspect of the present invention, which relates to any one of the sixteenth to twenty-ninth aspects of the present invention the semiconductor device has an arrangement in which the switching element is a switching element of an insulation gate type.

In the device according to the thirtieth aspect of the present invention, although the switching element is provided as an insulated gate switching element, which is inherently susceptible to oscillation, it is possible to suppress the oscillation; therefore, taking advantage of the feature of the insulated gate switching element that it is easily controlled, it becomes possible to widely apply the device to various apparatuses that need to control a great current.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a circuit diagram showing part of the semiconductor device according to the embodiment 5;

DESCRIPTION OF THE PREFERRED EMBODIMENTS

Outline of Embodiments

Figure 28:
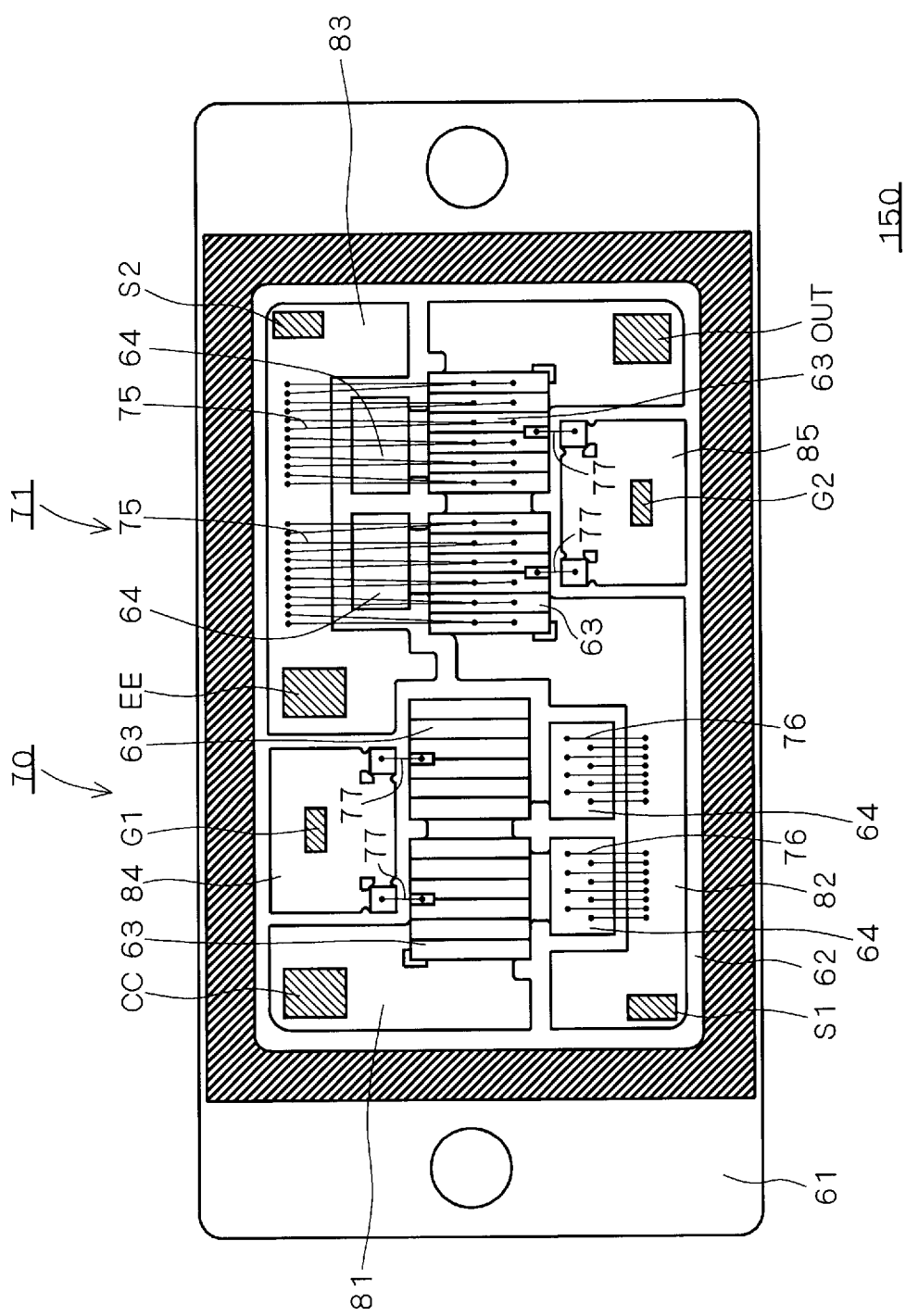
FIG. 28 is a plan sectional view that shows a conventional device.

As techniques of preventing such a phenomenon that a power module comprising a plurality of switching elements such as the semiconductor device 150 shown in FIG. 28 causes oscillation resulting from a short-circuit current or relaxing such oscillation, the inventor has supposed the following three approaches: (1) to uniformize reference potentials for the potentials of control electrodes (gate electrodes in IGBTs) of parallel-connected switching elements, i.e., the potentials of first main electrodes (emitter electrodes in IGBTs); (2) to provide an element absorbing oscillation; and (3) to reduce a short-circuit current.

When a short-circuit flows, increase rate ($=dI/dt$) of a main current (emitter current in an IGBT) exceeds increase in the main current I under normal switching operation. Due to such change in the main current, induced electromotive force V ($=-L \times dI/dt$) results from internal inductance L parasitically present in the power module and is superposed on the potentials of the control electrodes. This induced electromotive force V is applied in a direction pulling up the potentials of the control electrodes, i.e., a direction increasing the main current I. When increase of the potentials of the control electrodes exceeds a certain limit, vibration is caused on the potentials of the control electrodes.

While the induced electromotive force V is applied to each of the plurality of parallel-connected switching elements, each switching element independently operates in a transient state. Due to characteristic difference slightly present between the plurality of switching elements, therefore, exchange of vibration is caused between the plurality of switching elements to act in a direction enlarging oscillation. In order to suppress enlargement of oscillation, therefore, it is effective to uniformize reference potentials between the plurality of switching elements.

In order to uniformize the reference potentials between the plurality of switching elements, it is effective to connect first main electrodes of the plurality of switching elements formed on semiconductor chips on positions as close as possible to each other with a conductor not influenced by the main current I. In a power module having such means, the induced electromotive force V acting between the respective switching elements due to the increase (=dI/dt) in the main current I upon flowing of a short-circuit current is automatically balanced, thereby enabling suppression or prevention of oscillation. This is the first approach.

In the second approach, a voltage clamping element is interposed between the control electrodes and the first main electrodes of the plurality of parallel-connected switching elements. Thus, also when oscillation takes place, the potentials of the control electrodes can be suppressed below a certain limit. In other words, the strength of oscillation can be relaxed. When the switching elements are insulated gate switching elements such as IGBTs, influence on gate insulator films can be prevented due to relaxation of the strength of oscillation.

In order to suppress oscillation, it is effective to reduce the induced electromotive force V applied to the control electrodes. However, the internal inductance L parasitically present in the power module is already reduced to a limit level in the current technique inclusive of the semiconductor device 150 shown in FIG. 28. Therefore, the increase (=dI/dt) in the current must be suppressed in order to reduce the induced electromotive force V. The increase (=dI/dt) in the current can be reduced by keeping the potentials of the control electrodes of the plurality of switching elements low.

When a load is short-circuited, a large short-circuit current flows in a wiring pattern fed with the main current I. At this time, induced electromotive force is generated in the wiring pattern due to inductance specific to this portion. This induced electromotive force pulls up the potentials of the first main electrodes thereby pulling down the potentials of the control electrodes with reference to the first main electrodes and suppressing increase in the main current I in each switching element. This is the third approach.

Moreover, as described earlier, even in the case when only one switching element is installed on each of the upper arm and lower arm, if the main electrode of a switching element has a plurality of bonding pads divided into respective sections, oscillation might occur in the event of a short-circuiting current flowing through it. In order to suppress this oscillation, the above-mentioned first through third approaches may be applied, by using a plurality of bonding pads as the main electrodes of a plurality of switching elements.

Preferred embodiments of the present invention based on these three approaches are now described in detail. Embodiments 1 to 4 and 8 to 15 are based on the first approach, an embodiment 5 is based on the first and second approaches, and embodiments 6 and 7 are based on the first and third approaches respectively. Further, embodiments 16 and 17 are based on the third approach.

Embodiment 1

Figure 1:
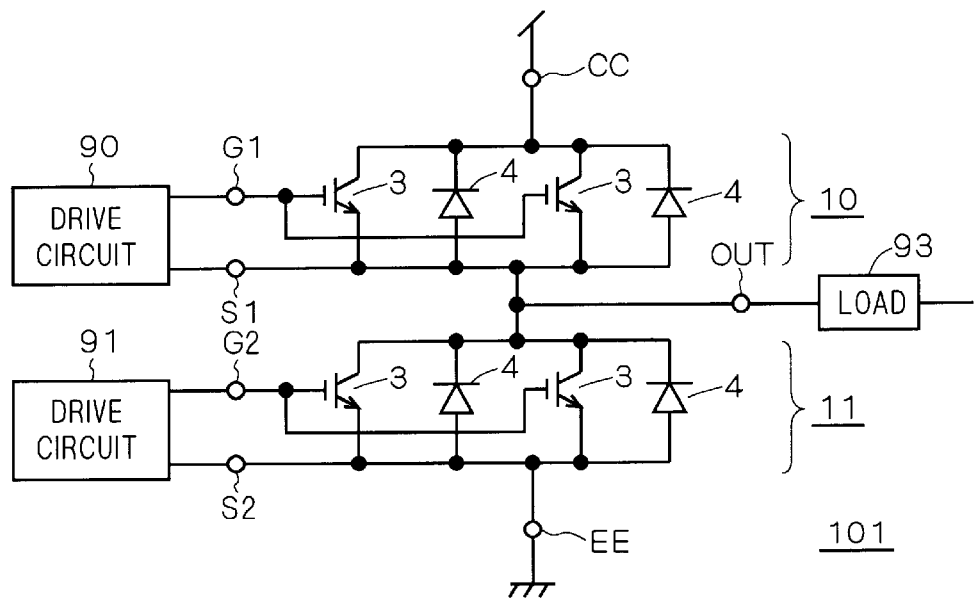
FIG. 1 is a circuit diagram of a semiconductor device according to an embodiment 1 of the present invention.
Figure 2:
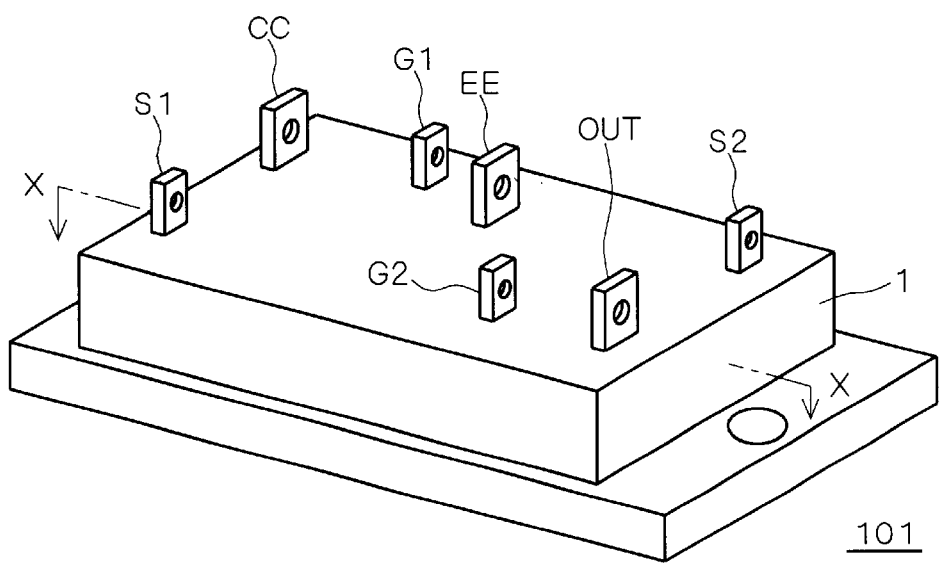
FIG. 2 is a perspective view showing the appearance of the semiconductor device according to the embodiment 1.
Figure 3:
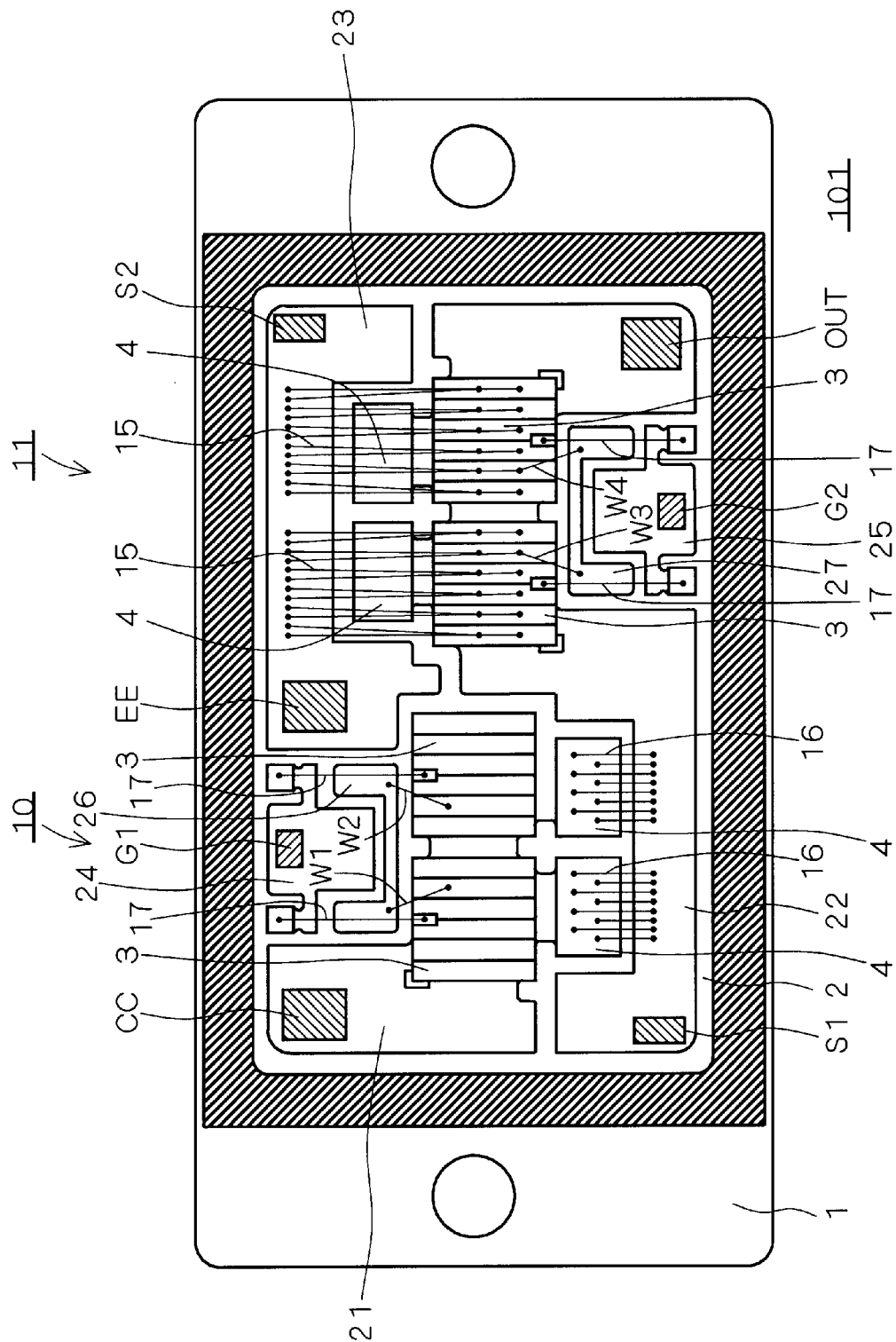
FIG. 3 is a plan sectional view of the semiconductor device according to the embodiment 1.

FIG. 1 is a circuit diagram of a semiconductor device 101 according to the embodiment 1 of the present invention. FIG. 2 is a perspective view showing the appearance of the semiconductor device 1 shown in FIG. 1, and FIG. 3 is a sectional view of the semiconductor device 101 taken along the line X—X in FIG. 2.

As shown in FIG. 1, the semiconductor device 101 comprises an upper arm 10 having two IGBTs 3 and two diodes 4 and a lower arm 11 similarly having two IGBTs 3 and two diodes 4. Power IGBTs are employed as the IGBTs 3, and power diodes are employed as the diodes 4. In other words, the semiconductor device 101 is formed as a power module comprising a plurality of power semiconductor elements.

In each of the upper and lower arms 10 and 11, emitter electrodes, collector electrodes and gate electrodes of the two IGBTs 3 are connected with each other. In other words, the two IGBTs 3 are connected in parallel with each other to function as a single IGBT together. The two diodes 4 are connected in parallel with the two IGBTs 3 in a direction circulating a forward current, to function as freewheel diodes. In other words, anodes of the diodes 4 are connected to the emitter electrodes of the IGBTs 3, and cathodes thereof are connected to the collector electrodes of the IGBTs 3.

The upper and lower arms 10 and 11 are serially connected with each other. The collector electrodes of the two IGBTs 3 of the upper arm 10 are connected to an external terminal CC, the gate electrodes are connected to an external terminal G1, and the emitter electrodes are connected to external terminals OUT and S1. The collector electrodes of the two IGBTs 3 of the lower arm 11 are connected to the external terminal OUT, the gate electrodes are connected to an external terminal G2, and the emitter electrodes are connected to external terminals EE and S2.

As shown in FIG. 2, these external terminals CC, G1, OUT, S1, G2 and S2 project outward from the upper surface of a case 1, thereby enabling connection to an external device (not shown). Referring again to FIG. 1, the external terminal CC is supplied with a high power supply potential (positive power supply potential in the example shown in FIG. 1), and the external terminal EE is supplied with a low power supply potential (ground potential in the example shown in FIG. 1). The external terminal OUT is connected with a load 93.

The external terminals G1 and S1 are connected with a drive circuit 90. The drive circuit 90 supplies a drive signal with reference to the potential of the external terminal S1 to the external terminal G1. The IGBTs 3 of the upper arm 10 are turned on/off in response to the drive signal input through the external terminal G1. Similarly, the external terminals G2 and S2 are connected with a drive circuit 91. The drive circuit 91 supplies a drive signal with reference to the potential of the external terminal S2 to the external terminal G2. The IGBTs 3 of the lower arm 11 are turned on/off in response to the drive signal input through the external terminal G2.

As shown in FIG. 3, the semiconductor device 101 comprises a substrate 2 on its bottom portion. A plurality of wiring patterns 21 to 27 isolated from each other are arranged on the main surface of the substrate 2 in the form of islands. The plurality of wiring patterns 21 to 27 are electrically insulated from each other. For such electrical insulation, the main surface of the substrate 2 may be an insulator, for example. Alternatively, an insulator may be interposed between the wiring patterns 21 to 27 and the substrate 2. The two IGBTs 3 and the two diodes 4 belonging to the upper arm 10 are arranged on the wiring pattern 21, and the two IGBTs 3 and the two diodes 4 belonging to the lower arm 11 are arranged on the wiring pattern 22.

The four IGBTs 3 and the four diodes 4 are formed as bare chips. Thus, the collector electrodes of the two IGBTs 3 and the cathodes of the two diodes 4 belonging to the upper arm 10 are electrically connected with each other through the wiring pattern 21. Similarly, the collector electrodes of the two IGBTs 3 and the cathodes of the two diodes 4 belonging to the lower arm 11 are electrically connected with each other through the wiring pattern 22.

The two diodes 4 and the two IGBTs 3 parallel-connected with each other are arranged to be adjacent to each other in one-to-one correspondence. In other words, arrangement is so performed that each diode 4 is adjacent to each IGBT 3. Thus, resistance and inductance between the diodes 4 and the IGBTs 3 are reduced and a protecting function of the diodes 4 serving as freewheel diodes for the IGBTs 3 is improved.

The external terminal CC is connected to the wiring pattern 21. In other words, the external terminal CC is electrically connected to the collector electrodes of the two IGBTs 3 belonging to the upper arm 10 and the cathodes of the two diodes 4 through the wiring pattern 21. Similarly, the external terminal OUT is connected to the wiring pattern 22. In other words, the external terminal OUT is electrically connected to the collector electrodes of the two IGBTs 3 belonging to the lower arm 11 and the cathodes of the two diodes 4 through the wiring pattern 22. FIG. 3 (and the following figures) shows connection parts between the wiring patterns 21 and 22 and the external terminals CC and OUT with hatching.

A number of conductor wires 15 connect the emitter electrodes of the two IGBTs 3 belonging to the upper arm 10 with the wiring pattern 22. A number of conductor wires 16 connect the anodes of the two diodes 4 belonging to the upper arm 10 with the wiring pattern 22. Similarly, a number of conductor wires 15 connect the emitter electrodes of the two IGBTs 3 belonging to the lower arm 11 with the wiring pattern 23. A number of conductor wires 16 connect the anodes of the two diodes 4 belonging to the lower arm 11 with the wiring pattern 23. The conductor wires 15 and 16 and conductor wires described later are formed by aluminum wires, for example.

FIG. 3 (and the following figures) omits illustration of the conductor wires 15 as to the upper arm 10 while omitting illustration of the conductor wires 16 as to the lower arm 11, in order to avoid complication.

The wiring pattern 22 extends along the direction of arrangement of the two IGBTs 3 belonging to the upper arm 10, and the wiring pattern 23 extends along the direction of arrangement of the two IGBTs 3 belonging to the lower arm 11. In each of the upper and lower arms 10 and 11, the conductor wires 15 connecting the emitter electrodes of the two parallel-connected IGBTs 3 with the wiring pattern 22 (or 23) are arranged in a direction substantially orthogonal to the direction of arrangement of the two IGBTs 3, to be minimized in length.

Similarly, the conductor wires 16 connecting the anodes of the parallel-connected two diodes 4 with the wiring pattern 22 (or 23) are arranged in a direction substantially orthogonal to the direction of arrangement of the two IGBTs 3, to be minimized in length. Consequently, the emitter electrodes of the two parallel-connected IGBTs 3 and the anodes of the two diodes 4 are connected to the wiring pattern 22 (or 23) through low resistance and low inductance.

The wiring pattern 22 is connected with the external terminal S1 in addition to the external terminal OUT, and the wiring pattern 23 is connected with the external terminals EE and S2. Thus, the emitter electrodes of the two IGBTs 3 and the anodes of the two diodes 4 belonging to the upper arm 10 are electrically connected with both of the external terminals OUT and S1 through the conductor wires 15 and 16 and the wiring pattern 22. Similarly, the emitter electrodes of the two IGBTs 3 and the anodes of the two diodes 4 belonging to the lower arm 11 are electrically connected with both of the external terminals EE and S2 through the conductor wires 15 and 16 and the wiring pattern 23.

The wiring pattern 24 is connected with the external terminal G1, and conductor wires 17 connect the wiring pattern 24 with the gate electrodes of the two IGBTs 3 belonging to the upper arm 10. In other words, the external terminal G1 and the gate electrodes of the IGBTs 3 are electrically connected with each other through the conductor wires 17 and the wiring pattern 24. Similarly, the wiring pattern 25 is connected with the external terminal G2, and conductor wires 17 connect the wiring pattern 25 with the gate electrodes of the two IGBTs 3 belonging to the lower arm 11. In other words, the external terminal G2 and the gate electrodes of the IGBTs 3 are electrically connected with each other through the conductor wires 17 and the wiring pattern 25.

Conductor wires W1 and W2 connect the wiring pattern 26 with the emitter electrodes of the two IGBTs 3 belonging to the upper arm 10. Thus, the emitter electrodes of the two IGBTs 3 belonging to the upper arm 10 are electrically connected with each other through the conductor wires W1 and W2 and the wiring pattern 26, which are paths not relaying the wiring pattern 22 and not fed with an emitter current flowing through the external terminal OUT. Consequently, the emitter potentials of the two IGBTs 3 belonging to the upper arm 10 are so uniformized that the potentials of the gate electrodes of the two IGBTs 3 are inhibited from oscillation also when the load 93 is short-circuited.

Similarly, conductor wires W3 and W4 connect the wiring pattern 27 with the emitter electrodes of the two IGBTs 3 belonging to the lower arm 11. Thus, the emitter electrodes of the two IGBTs 3 belonging to the lower arm 11 are electrically connected with each other through the conductor wires W3 and W4 and the wiring pattern 27, which are paths not relaying the wiring pattern 23 and not fed with an emitter current flowing through the external terminal EE. Consequently, the emitter potentials of the two IGBTs 3 belonging to the lower arm 11 are so uniformized that the potentials of the gate electrodes of the two IGBTs 3 are inhibited from oscillation also when the load 93 is short-circuited.

Connection between the emitter electrodes of the two IGBTs 3 for uniformizing the emitter potentials is readily implemented by connecting the emitter electrodes with the wiring pattern 26 (or 27) through the conductor wires W1 and W2 (or W3 and W4). In other words, manufacturing steps are advantageously simplified. Further, first ends of the conductor wires W1 and W2 (or W3 and W4) are connected to the wiring pattern 26 (or 27), whereby no wire cutting may be performed on the IGBTs 3 in a step of arranging the conductor wires W1 and W2 (or W3 and W4). Thus, the conductor wires W1 and W2 (or W3 and W4) can be readily arranged without requiring specific means for preventing damage of the IGBTs 3.

Further, the wiring pattern 22 extends along the direction of arrangement of the two IGBTs 3 belonging to the upper arm 10 and the wiring pattern 26 also extends along the direction of arrangement of the IGBTs 3 on the opposite side of the wiring paten 22 through the IGBTs 3. Thus, the conductor wires W1 and W2 can be readily arranged without interfering with the conductor wires 15. In addition, inductive coupling between the conductor wires 15 and the conductor wires W1 and W2 can be reduced, thereby improving the effect of suppressing oscillation.

Similarly, the wiring pattern 23 extends along the direction of arrangement of the two IGBTs 3 belonging to the lower arm 11 and the wiring pattern 27 also extends along the direction of arrangement of the IGBTs 3 on the opposite side of the wiring pattern 23 through the IGBTs 3. Therefore, an effect similar to that described above in relation to the upper arm 10 can be attained also as to the lower arm 11.

In each of the upper and lower arms 10 and 11, further, the two diodes 4 are arranged between the two IGBTs 3 and the wiring pattern 22 (or 23), whereby the conductor wires W1 and W2 (or W3 and W4) can be readily arranged without interfering with the conductor wires 16 connecting the anodes of the two diodes 4 with the wiring pattern 22 (or 23) either.

The wiring pattern 26 is adjacent to the two IGBTs 3 belonging to the upper arm 10 without the remaining wiring patterns interposed therebetween. Therefore, the conductor wires W1 and W2 can be set short. Thus, inductance of the paths electrically connecting the emitter electrodes of the two IGBTs 3 belonging to the upper arm 10 with each other is reduced, whereby the effect of uniformizing the potentials of the emitter electrodes can be further improved. Similarly, the wiring pattern 27 is adjacent to the two IGBTs 3 belonging to the lower arm 11 without through the remaining wiring patterns interposed therebetween. Also as to the lower arm 11, therefore, an effect similar to that described above in relation to the upper arm 10 can be attained.

While two IGBTs 3 and two diodes 4 are connected in parallel with each other in FIGS. 1 to 3, three or more IGBTs 3 and three or more diodes 4 may alternatively be connected in parallel with each other.

Embodiment 2

Figure 4:
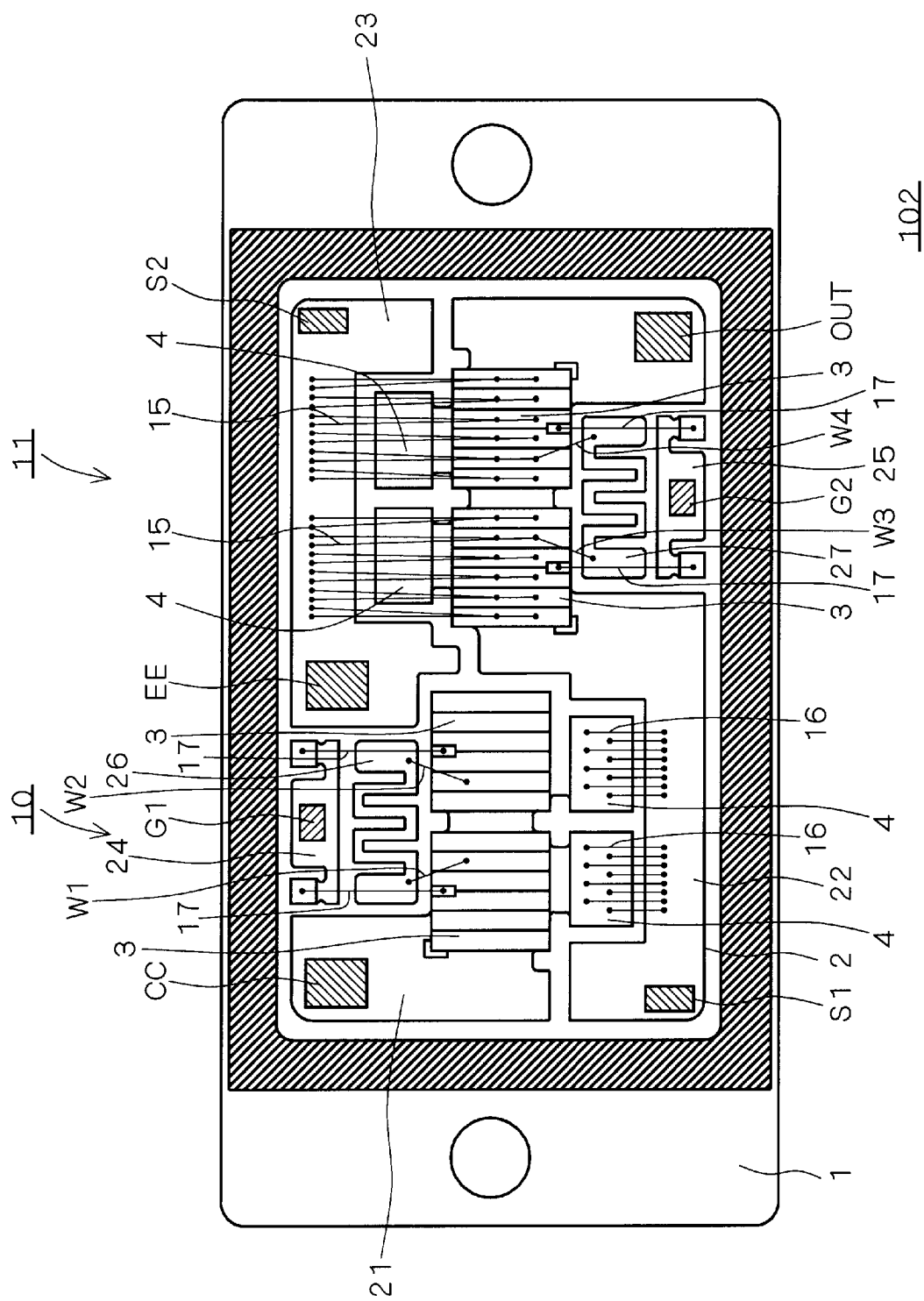
FIG. 4 is a plan sectional view of a semiconductor device according to an embodiment 2 of the present invention.

FIG. 4 is a plan sectional view of a semiconductor device 102 according to the embodiment 2 of the present invention. A circuit diagram and a perspective view of the appearance of the semiconductor device 102 are identical to FIGS. 1 and 2 showing the embodiment 1 respectively, and FIG. 4 is a sectional view of the semiconductor device 102, corresponding to the sectional view of the semiconductor device 101 taken along the line X—X in FIG. 2. In the following figures, parts identical or corresponding to (having the same functions as) those of the semiconductor device 101 shown in FIGS. 1 to 3 are denoted by the same reference numerals, to omit redundant description.

The semiconductor device 102 is characteristically different from the semiconductor device 101 shown in FIG. 3 in that each of wiring patterns 26 and 27 has a repetitive bent portion. It has been confirmed by an experiment that an optimum value for suppressing oscillation is present in the inductance of a path connecting emitter electrodes of two IGBTs 3 connected in parallel with each other without through a wiring pattern 22 (or 23). In the semiconductor device 102, each of the wiring patterns 26 and 27 has the repetitive bent portion, whereby the inductance of a path electrically connecting emitter electrodes of two parallel-connected IGBTs 3 can be freely controlled by changing positions for connecting conductor wires W1 to W4. Thus, the inductance of each of the wiring patterns 26 and 27 can be finely adjusted to the optimum value in the final stage of steps of manufacturing the semiconductor device 102.

While two IGBTs 3 and two diodes 4 are parallel-connected with each other in FIG. 3, three or more IGBTs 3 and three or more diodes 4 may alternatively be connected in parallel with each other.

Embodiment 3

Figure 5:
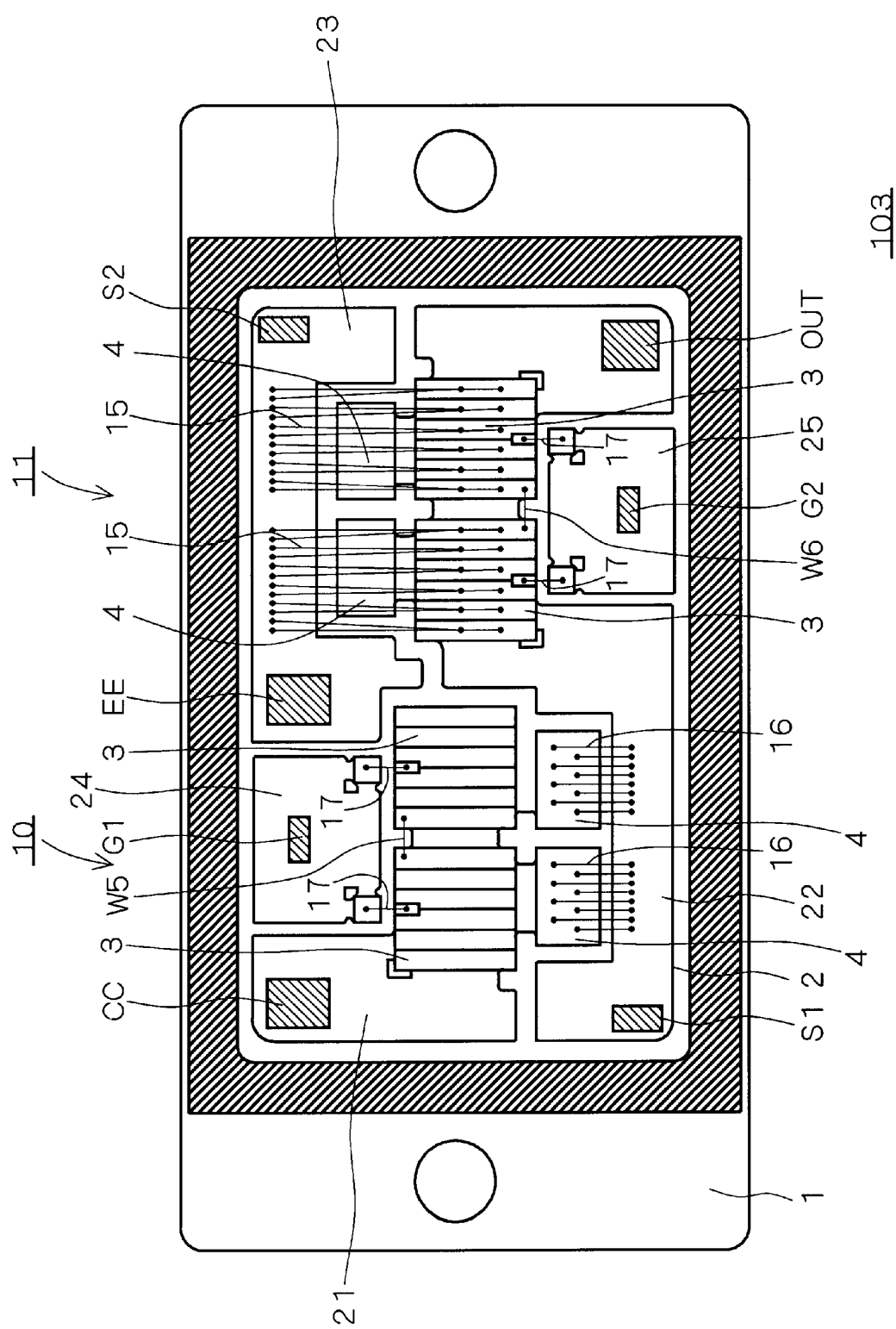
FIG. 5 is a plan sectional view of a semiconductor device according to an embodiment 3 of the present invention.

FIG. 5 is a plan sectional view of a semiconductor device 103 according to the embodiment 3 of the present invention. A circuit diagram and a perspective view of the appearance of the semiconductor device 103 are identical to FIGS. 1 and 2 showing the embodiment 1 respectively, and FIG. 5 is a sectional view of the semiconductor device 103, corresponding to the sectional view of the semiconductor device 101 taken along the line X—X in FIG. 2.

The semiconductor device 103 is characteristically different from the semiconductor device 101 shown in FIG. 3 in a point that neither wiring patterns 26 and 27 nor conductor wires W1 to W4 are provided but a conductor wire W5 (or W6) directly connects emitter electrodes of two parallel-connected IGBTs 3 with each other. Since no wiring patterns 26 and 27 are required, manufacturing steps are simplified and the area of a substrate 2 can be reduced for miniaturizing the semiconductor device 103.

As shown in FIG. 5, the conductor wire W5 (or W6) is arranged along the direction of arrangement of the two parallel-connected IGBTs 3 in each of upper and lower arms 10 and 11. Consequently, the conductor wire W5 (or W6) is substantially orthogonal to conductor wires 15 connecting the two parallel-connected IGBTs 3 with a wiring pattern 22 (or 23). Thus, inductive coupling between the conductor wires 15 and the conductor wire W5 (or W6) is suppressed low for further improving an effect of suppressing oscillation.

In each of the upper and lower arms 10 and 11, further, the conductor wire W5 (or W6) is connected to the emitter electrodes of the two IGBTs 3 on a portion farther from the wiring pattern 23 (or 23) than an end of the conductor wire 15. Thus, inductive coupling between the conductor wires 15 and the conductor wire W5 (or W6) is further suppressed lower thereby further improving the effect of suppressing oscillation. In addition, the conductor wires 15 and the conductor wire W5 (or W6) can be readily arranged without interfering with each other.

While two IGBTs 3 and two diodes 4 are connected in parallel with each other in FIG. 5, three or more IGBTs 3 and three or more diodes 4 may alternatively be connected in parallel with each other. In this case, the emitter electrodes may be individually connected with each other through a conductor wire between two adjacent ones of the plurality of parallel-connected IGBTs 3, or three or more portions, including an intermediate portion, of the conductor wire may be connected to the emitter electrodes thereby connecting emitter electrodes of three or more IGBTs 3 through a single conductor wire.

Embodiment 4

Figure 6:
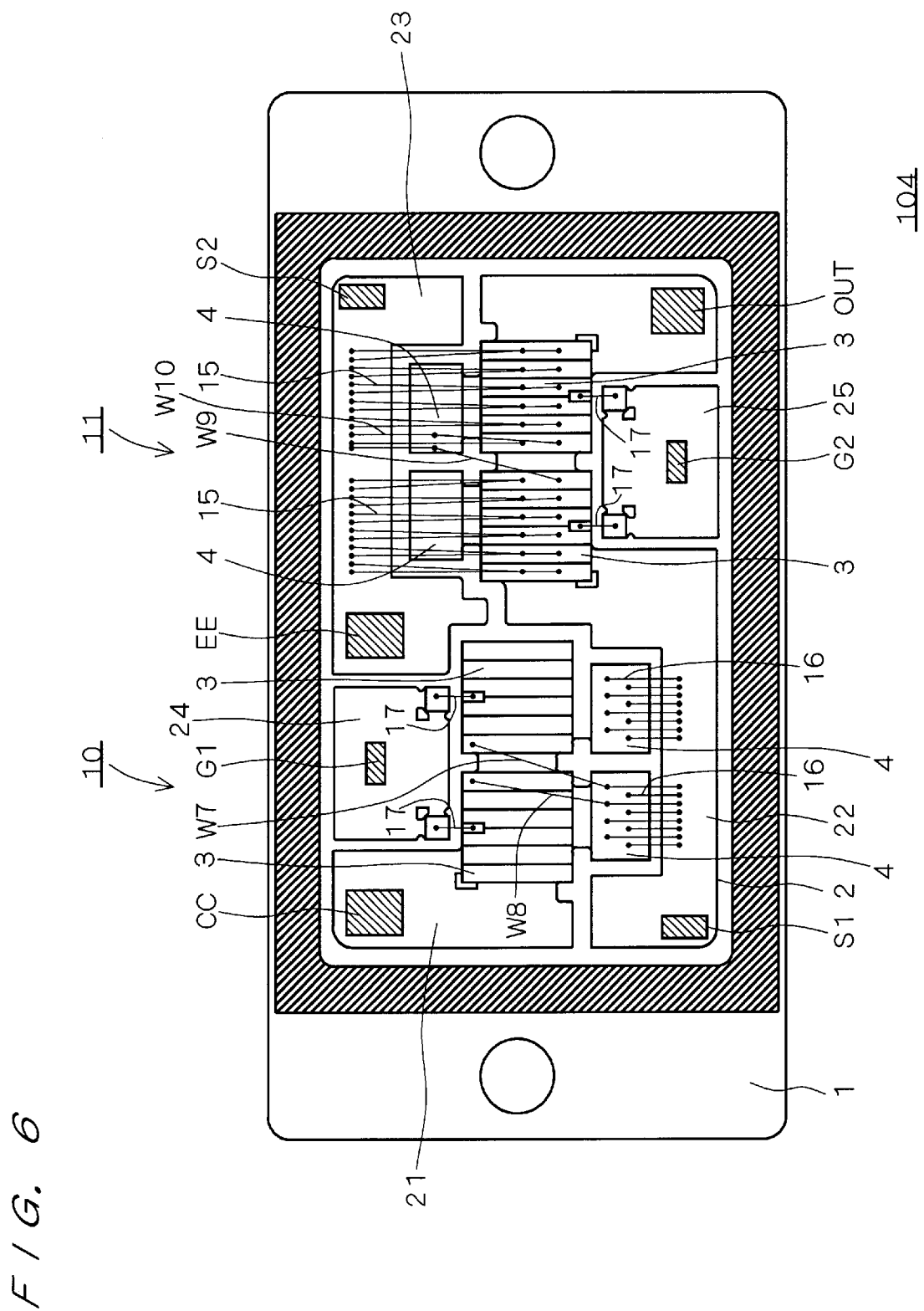
FIG. 6 is a plan sectional view of a semiconductor device according to an embodiment 4 of the present invention.

FIG. 6 is a plan sectional view of a semiconductor device 104 according to the embodiment 4 of the present invention. A circuit diagram and a perspective view of the appearance of the semiconductor device 104 are identical to FIGS. 1 and 2 showing the embodiment 1 respectively, and FIG. 6 is a sectional view of the semiconductor device 104, corresponding to the sectional view of the semiconductor device 101 taken along the line X—X in FIG. 2.

The semiconductor device 104 is characteristically different from the semiconductor device 101 shown in FIG. 3 in a point that neither wiring patterns 26 and 27 nor conductor wires W1 to W4 are provided but conductor wires W7 and W8 (or W9 and W10) connect emitter electrodes of two parallel-connected IGBTs 3 to an anode of one of two diodes 4 and a wiring pattern 22 (or 23). In other words, first ends of the conductor wires W7 and W8 (or W9 and W10) are connected to the emitter electrodes of the two parallel-connected IGBTs 3, intermediate portions are connected to the anode of one of the two diodes 4, and second ends are connected to the wiring pattern 22 (or 23).

Therefore, the emitter electrodes of the two parallel-connected IGBTs 3 are electrically connected with each other through the conductor wire W7 (or W9), the anode of the diode 4 and the conductor wire W8 (or W10) without through the wiring pattern 22 (or 23) fed with an emitter current. Consequently, the potentials of the emitter electrodes of the two parallel-connected IGBTs 3 are uniformized for attaining an effect of suppressing oscillation, similarly to the semiconductor device 101 (FIG. 3).

Further, second ends of the conductor wires W7 and W8 (or W9 and W10) are connected to a second wiring pattern, whereby no wire cutting may be performed on any of the IGBTs 3 and the diodes 4 in a step of arranging the conductor wires W7 and W8 (or W9 and W10). Therefore, no means for preventing damage of the IGBTs 3 and the diodes 4 may be required in manufacturing steps. In other words, the manufacturing steps can advantageously be simplified.

While two IGBTs 3 and two diodes 4 are connected in parallel with each other in FIG. 6, three or more IGBTs 3 and three or more diodes 4 may alternatively be parallel-connected. In this case, a plurality of conductor wires are arranged so that the emitter electrodes of all IGBTs 3 are electrically connected through the anode(s) of a single or a plurality of diodes 4 and a plurality of conductor wires without through the wiring pattern 22 (or 23). Also in this case, first ends of the conductor wires are connected to the emitter electrodes of the IGBTs 3, intermediate potions are connected to the anodes of the diodes 4 and second ends are connected to the wiring pattern 22 (or 23). While the first end of at least one conductor wire is connected to all of the plurality of IGBTs 3, it is possible to employ such a configuration that the intermediate portions of the conductor wires are connected to only part of the plurality of diodes 4.

Embodiment 5

Figure 7:
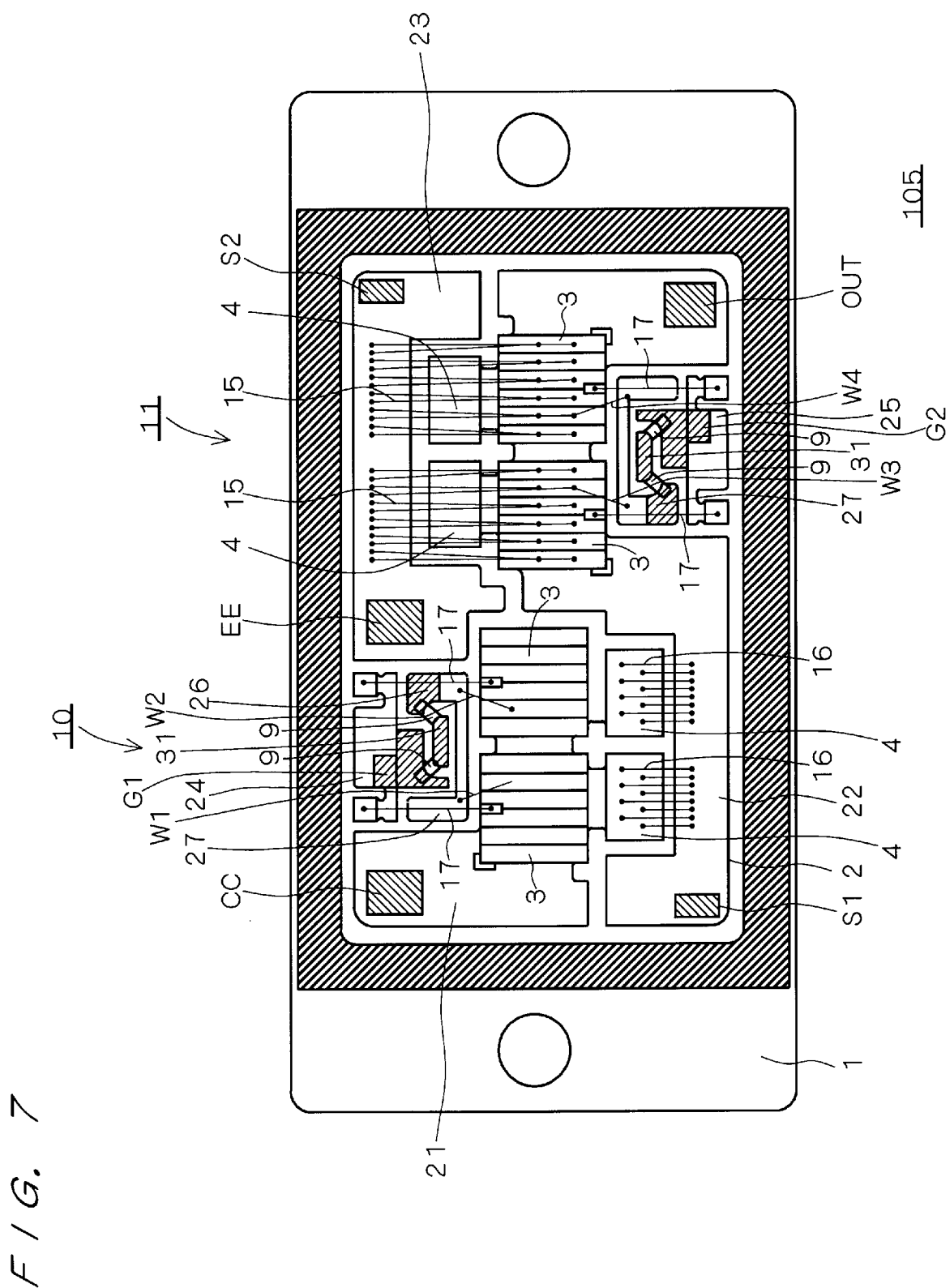
FIG. 7 is a plan sectional view of a semiconductor device according to an embodiment 5 of the present invention.

FIG. 7 is a plan sectional view of a semiconductor device 105 according to the embodiment 5 of the present invention. FIG. 8 is a circuit diagram o a part of the semiconductor device 105. A perspective view of the appearance of the semiconductor device 105 is identical to FIG. 2 showing the embodiment 1, and FIG. 7 is a sectional view of the semiconductor device 105, corresponding to the sectional view of the semiconductor device 101 taken along the line X—X in FIG. 2.

The semiconductor device 105 is characteristically different from the semiconductor device 101 shown in FIG. 3 in a point that two Zener diodes 9 serially connected with each other so that the direction of a forward current is reversed are interposed between a wiring pattern 24 (or 25) and a wiring pattern 26 (or 27). The two Zener diodes 9 are connected with each other through a wiring pattern 31 arranged on a substrate 2. The two serially connected Zener diodes 9 form a voltage clamping element 30.

The voltage clamping element 30 prevents the potential difference between gate electrodes and emitter electrodes of two parallel-connected IGBTs 3 from increasing beyond a certain limit. Also when oscillation takes place by any chance, therefore, its amplitude is suppressed not to exceed a certain limit.

While two IGBTs 3 and two diodes 4 are connected in parallel with each other in the example shown in FIG. 7, three or more IGBTs 3 and three or more diodes 4 may alternatively be connected in parallel with each other. While the clamping element 30 is provided on the semiconductor device 101 of FIG. 3 in FIG. 7, it is also possible to provide the clamping element 30 on the semiconductor device 102 of FIG. 4.

The clamping element 30 may alternatively be electrically connected between emitter electrodes and gate electrodes of a plurality of parallel-connected IGBTs 3 without providing the wiring pattern 26 (or 27) and conductor wires W1 and W2 (or W3 ad W4). For example, the clamping element 30 may be connected between a wiring pattern 22 (or 23) and the wiring pattern 24 (or 25). Although occurrence of oscillation cannot be suppressed in this mode, it is possible to suppress the amplitude of the occurring oscillation below a certain limit.

Embodiment 6

Figure 9:
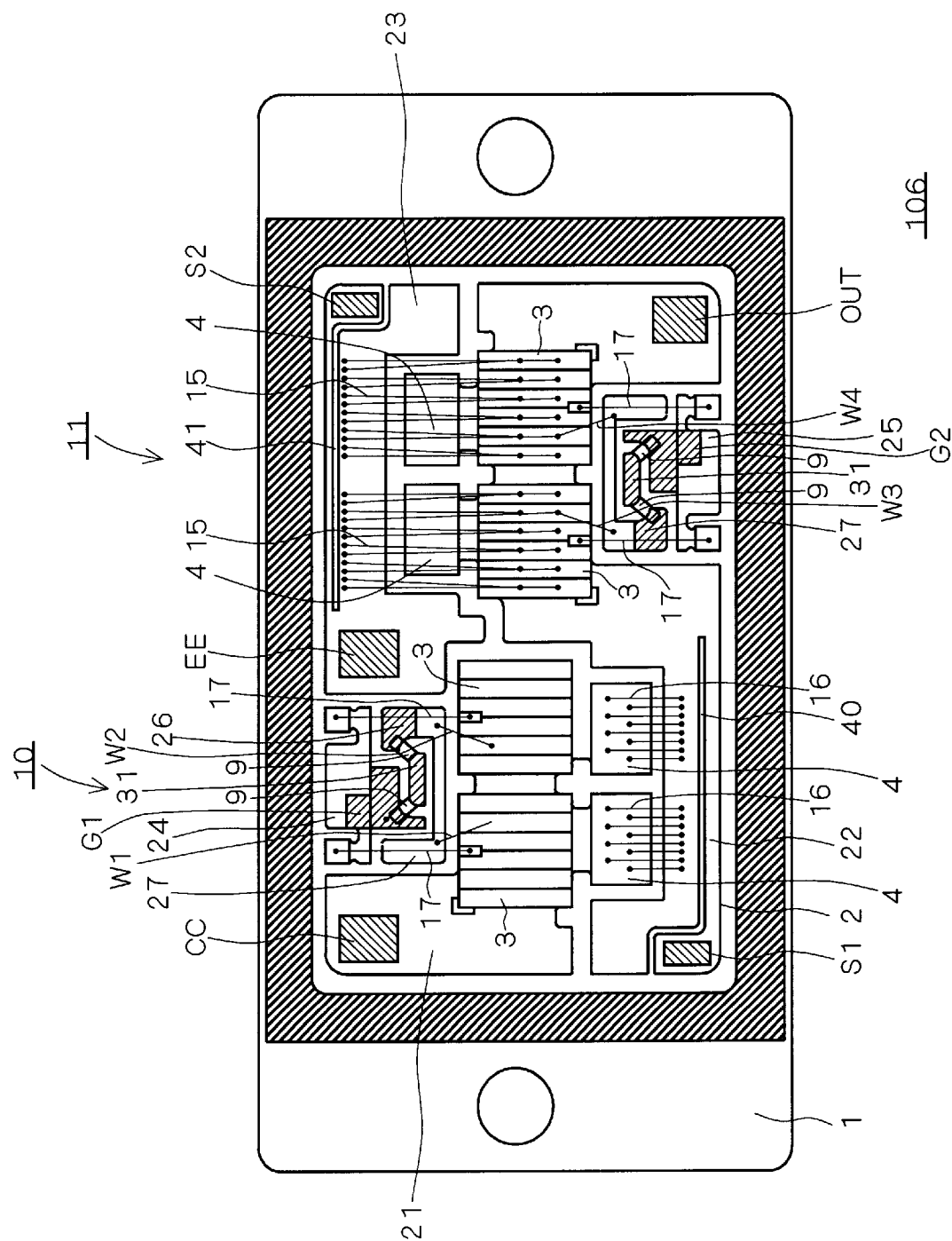
FIG. 9 is a plan sectional view of a semiconductor device according to an embodiment 6 of the present invention.

FIG. 9 is a plan sectional view of a semiconductor device 106 according to the embodiment 6 of the present invention. A perspective view of the appearance of the semiconductor device 106 is identical to FIG. 2 showing the embodiment 1, and FIG. 9 is a sectional view of the semiconductor device 106, corresponding to the sectional view of the semiconductor device 101 taken along the line X—X in FIG. 2.

The semiconductor device 106 is characteristically different from the semiconductor device 105 shown in FIG. 7 in that a wiring pattern 22 (or 23) extending along the direction of arrangement of two parallel-connected IGBTs 3 is formed with a slit 40 (or 41). The slit 40 (or 41) extends along the aforementioned direction of arrangement for leaving a coupling portion on the side of a first end of the aforementioned direction of arrangement while leaving no coupling portion on the side of a second end. In other words, the slit 40 (or 41) extends from the side of the aforementioned second end toward the side of the aforementioned first end for leaving the coupling portion on the side of the first end.

Figure 10:
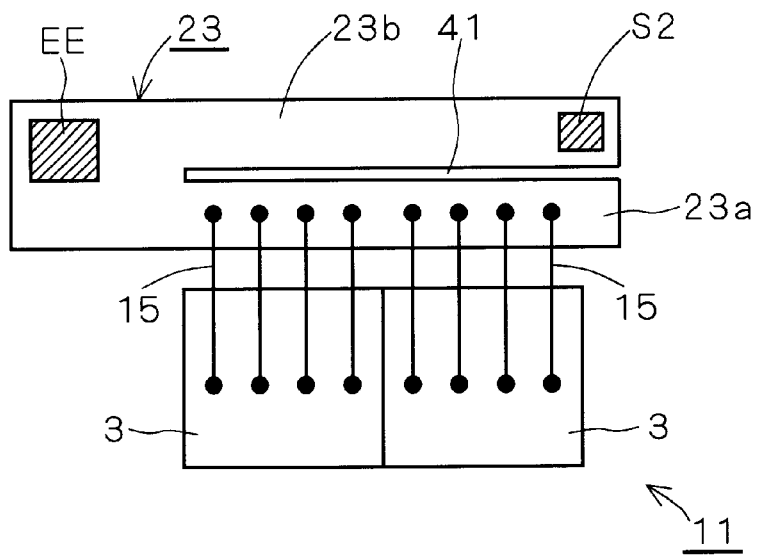
FIG. 10 is a model diagram showing part of the semiconductor device according to the embodiment 6.
Figure 11:
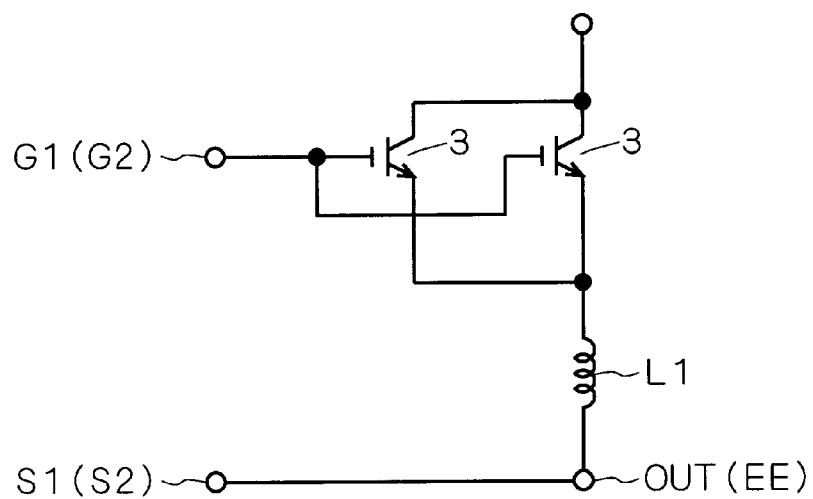
FIG. 11 is a circuit diagram showing part of the semiconductor device according to the embodiment 6.

As FIG. 10 typically shows an exemplary wiring pattern 23, conductor wires 15 (and 16) are connected to a first portion 23a, closer to the two IGBTs 3 than the slit 40 (41), of the wiring pattern 22 (or 23). An external terminal OUT (or EE) is connected to the coupling portion on the side of the aforementioned first end of the wiring pattern 22 (or 23). Further, an external terminal S1 (or S2) is connected to the side of the aforementioned second end of a second portion 23b, farther from the two IGBTs 3 than the slit 40 (41), of the wiring pattern 22 (or 23). Therefore, a circuit diagram of FIG. 11 shows the relation among the two parallel-connected IGBTs 3, the external terminal OUT (or EE) and the external terminal S1 (S2).

An emitter current passes through the first portion 23a and flows to the external terminal OUT (or EE). When the emitter current abruptly increases due to short-circuiting of a load 93 or the like, therefore, counter electromotive force is generated between the emitter electrodes of the IGBTs 3 and the external terminal OUT (or EE) due to inductance L1 of the first portion 23a. In other words, the potentials of the emitter electrodes of the IGBTs 3 with reference to the potential of the external terminal OUT (or EE) increase. However, the potential of the external terminal S1 (or S2) remains equivalent to the potential of the external terminal OUT (or EE), and hence a gate voltage applied across the gate electrodes and the emitter electrodes of the IGBTs 3 is pulled down by the increased potentials of the emitter electrodes. Consequently, the emitter current is inhibited from increasing and an effect of suppressing oscillation is further improved.

While two IGBTs 3 and two diodes 4 are connected in parallel with each other in FIG. 9, three or more IGBTs 3 and three or more diodes 4 may alternatively be connected in parallel with each other. While the slits 40 and 41 are formed on the semiconductor device 105 of FIG. 7 in FIG. 9, it is also possible to provide the slits 40 and 41 on the semiconductor devices 101 to 104, for similarly improving the effect of suppressing oscillation.

The slit 40 (or 41) may be provided on the wiring pattern 22 (or 23) without providing a wiring pattern 26 (or 27) and conductor wires W1 and W2 (or W3 and W4) and without providing conductor wires W5 and W6. The effect of suppressing oscillation is suitably attained also in this configuration.

Embodiment 7

Figure 12:
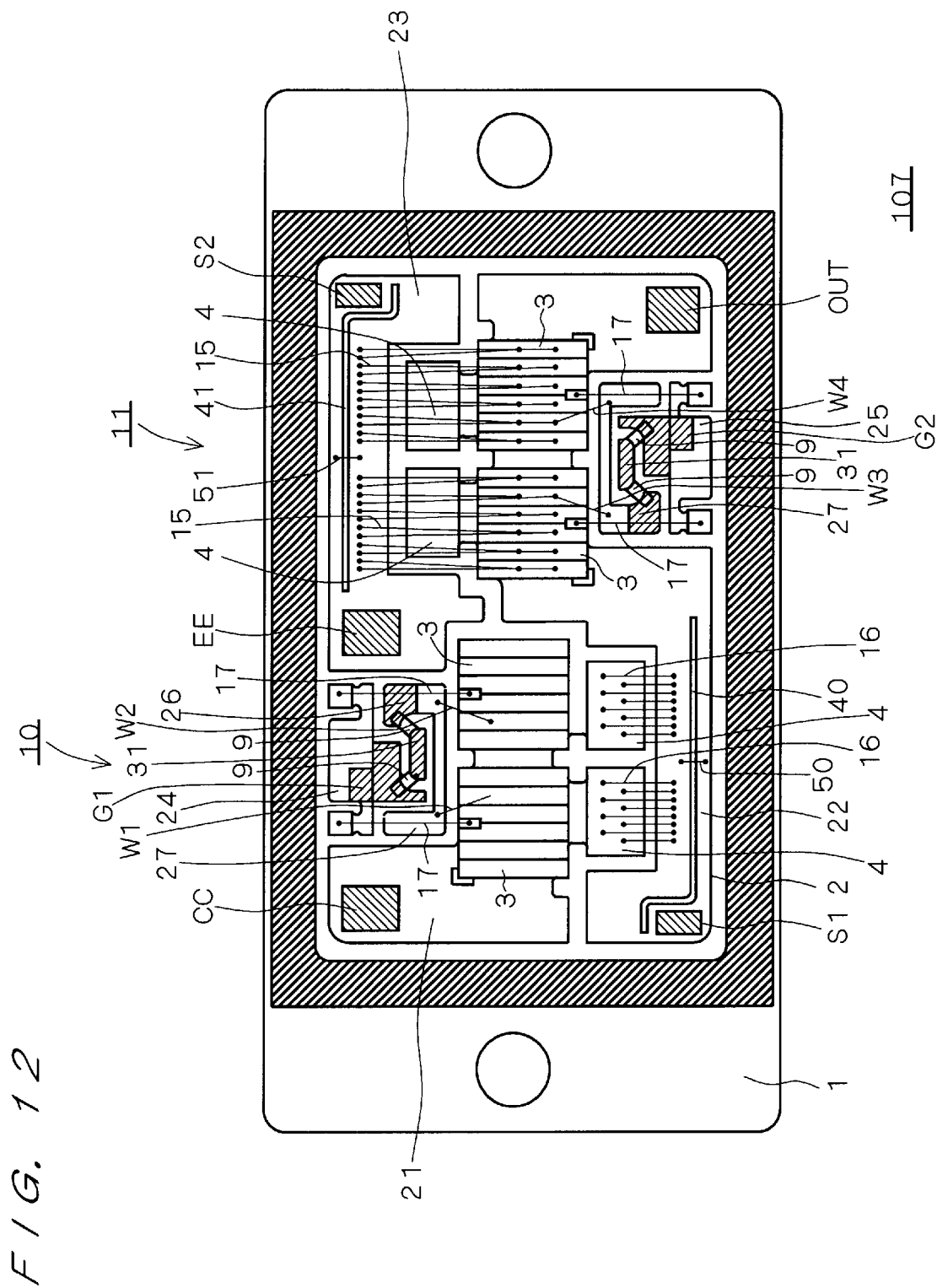
FIG. 12 is a plan sectional view of a semiconductor device according to an embodiment 7 of the present invention.

FIG. 12 is a plan sectional view of a semiconductor device 107 according to the embodiment 7 of the present invention. A perspective view of the appearance of the semiconductor device 107 is identical to FIG. 2 showing the embodiment 1, and FIG. 12 is a sectional view of the semiconductor device 107, corresponding to the sectional view of the semiconductor device 101 taken along the line X—X in FIG. 2.

Figure 13:
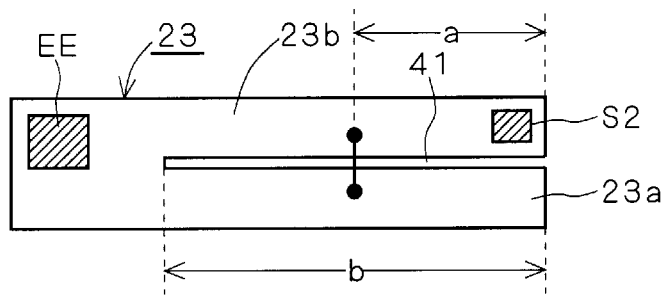
FIGS. 13 and 14 are model diagrams showing part of the semiconductor device according to the embodiment 7.
Figure 14:
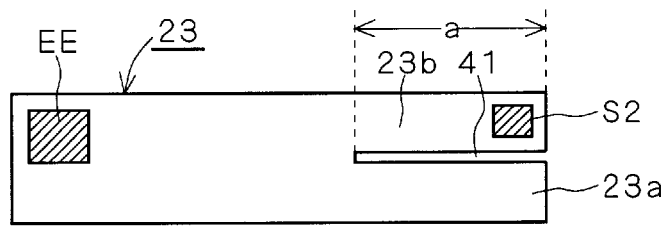
Figure 15:
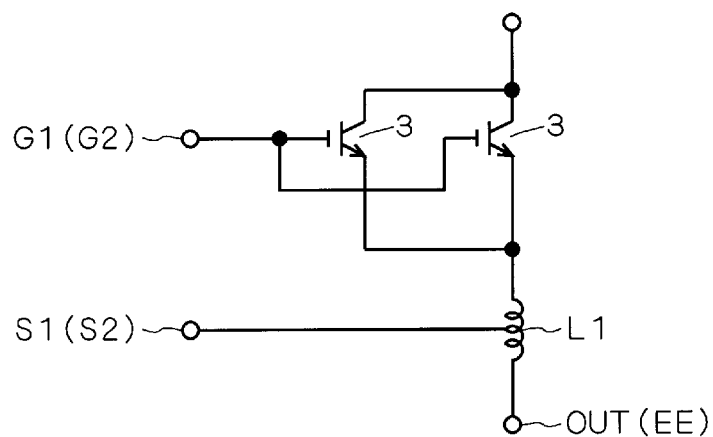
FIG. 15 is a circuit diagram showing part of the semiconductor device according to the embodiment 7.

The semiconductor device 107 is characteristically different from the semiconductor device 106 of FIG. 9 in a point that a conductor wire 50 (or 51) connects a first portion 23a and a second portion 23b opposed to each other through a slit 40 (or 41) formed on a wiring pattern 22 (or 23). As FIG. 13 typically shows an exemplary wiring pattern 23, arrangement of the conductor wire 51 on a position of a distance a from an opening end of the slit 41 is substantially equivalent to that the depth b of the slit 41 is changed to a depth a identical to the distance a as shown in FIG. 14 in the relation between the potentials of external terminals EE and S2. This also applies to the conductor wire 50 set on the wiring pattern 22. When the conductor wire 50 (or 51) is arranged, therefore, a circuit diagram of FIG. 15 shows the relation among the two parallel-connected IGBTs 3, an external terminal OUT (or EE) and an external terminal S1 (or S2).

In other words, the potential of the external terminal S1 (or S2) can be freely controlled between the potentials of the emitter electrodes of the IGBTs 3 and the potential of the external terminal OUT (or EE) by changing the position for arranging the conductor wire 50 (or 51). Thus, it is possible to finely adjust individuals of mass-produced semiconductor devices 107 in the final stage of manufacturing steps so that the characteristics thereof are uniform.

Construction of an IGBT in Respective Embodiments

Figure 16:
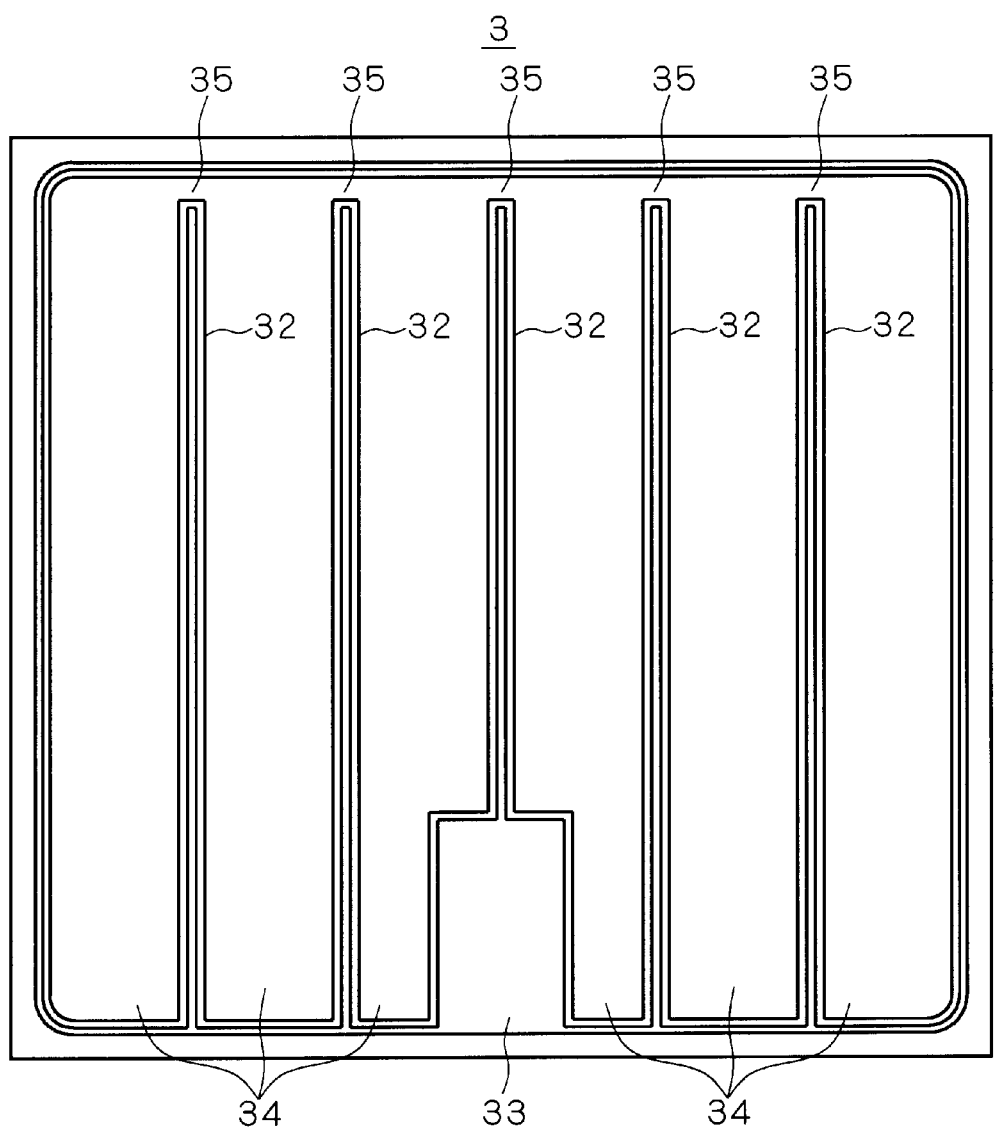
FIG. 16 is a plan view that shows an IGBT in accordance with the respective embodiments.

FIG. 16 is a plan view that shows an IGBT 3 that is installed in each of the semiconductor devices 101 to 107 in accordance with the above-mentioned embodiments 1 to 7 and semiconductor devices 108 to 117 that will be described in the following embodiments 8 to 17. The IGBT 3 is provided with a gate wire 32, a gate pad 33 and a plurality of emitter pads 34 on its upper face. The gate wire 32 is connected to the gate pad 33. A conductor wire 17, for example, shown in FIG. 3, is connected to the gate pad 33.

In other words, the gate pad 33 serves as a bonding pad of the gate electrode. The emitter pads 34 form portions that are connectable to the conductor wire among the emitter electrodes covering most of the portions of the upper face of the IGBT 3. That is, the emitter pads 34 serve as bonding pads of the emitter electrodes.

In the inner portion (not shown) of the IGBT 3, a number of (for example, approximately, 100,000) basic units, referred to as unit cells (minimum units, each functioning as an IGBT), are parallel-connected to each other. The gate electrode of each unit cell is connected to the gate pad 33 through the gate wire 32, and the emitter electrodes, which cover most of the portions on the upper face of the IGBT 3, are commonly connected to all the unit cells. In the IGBT 3, in order to operate these numerous unit cells as uniformly as possible, the gate wire 32 is placed in a manner so as to branch from the gate pad 33 that receives a gate voltage through the conductor wire 17 (FIG. 3). The gate wire 32 is also referred to as a gate finger, which is derived from its shape. Thus, the emitter electrodes, which cover most of the portions of the upper face of the IGBT 3, are divided by the gate wire 32 into a plurality of areas, that is, a plurality of emitter pads 34.

The emitter pads 34 are integrally connected to one after another through bridging portions 35 corresponding to gaps of the gate wire 32 among the emitter electrodes. Each of the bridging portions 35 is distinct from the emitter pad 34 connectable to the conductive wire in that it is too narrow a portion to be connected to the conductor wire. The conductor wire is uniformly connected to the respective emitter pads 34 so that the emitter current of the IGBT 3 is allowed to flow the respective emitter pads 34 individually during the normal operation of the IGBT 3, while it hardly flows the bridging portions 35. As a result, although the bridging portions 35 are sufficiently narrow, potentials are uniformly maintained among the emitter pads 34 during the normal operation.

However, in the event of a flow of a short-circuiting current, the magnitude of the current flowing through the bridging portion 35 is not ignorable, and irregularities in the potential tend to occur between the emitter pads 34. Consequently, even in the case of a semiconductor device in which only one IGBT 3 is installed on each of the upper arm 10 and the lower arm 11 (FIG. 1), an oscillating phenomenon might appear in the IGBT 3. In the following embodiments 8 to 17, an explanation will be given of a semiconductor device which can suppress the oscillating phenomenon derived from the irregularities of the potential among the emitter pads 34.

Embodiment 8

Figure 17:
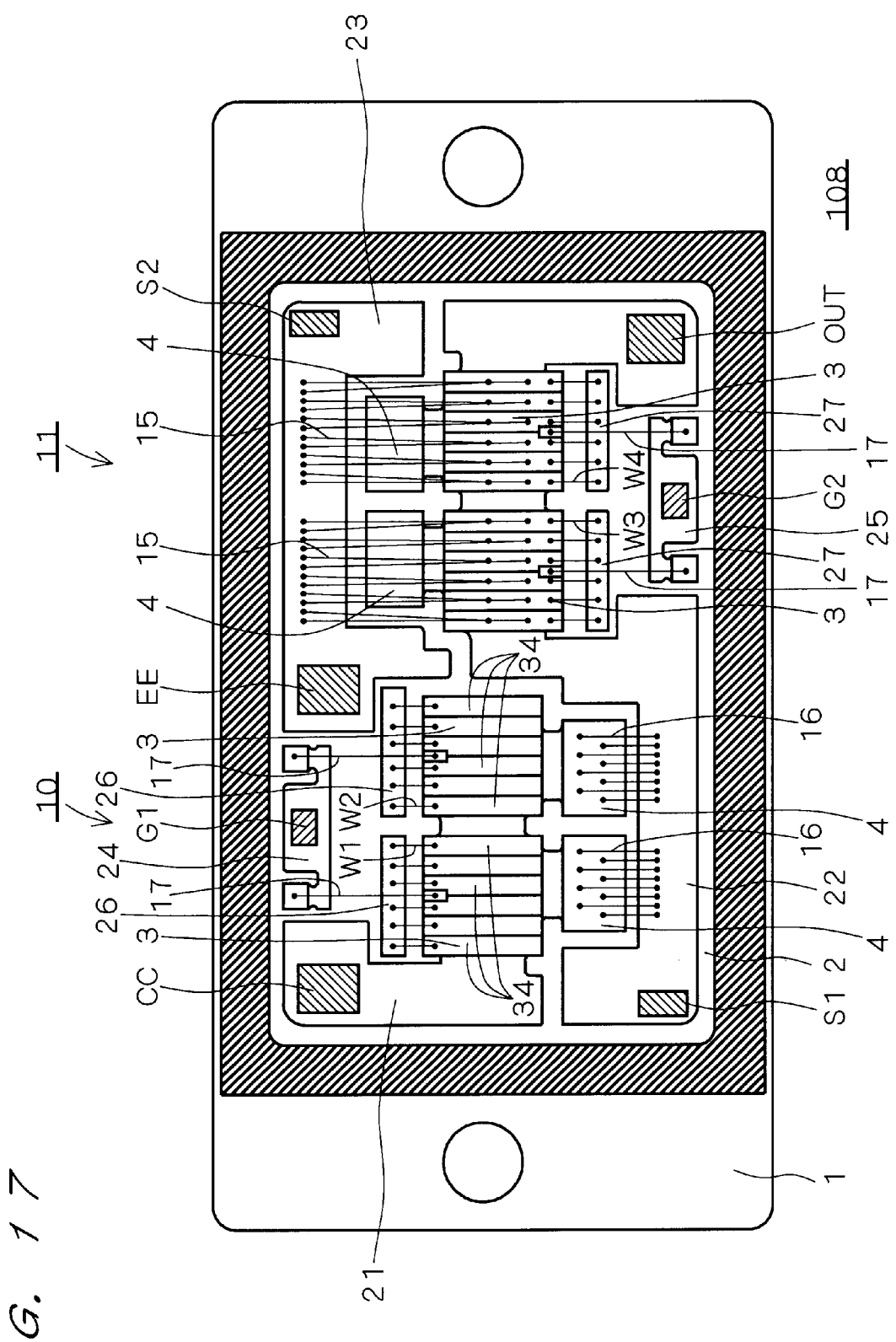
FIG. 17 is a plan sectional view that shows a device in accordance with an embodiment 8.

FIG. 17 is a plan sectional view of a semiconductor device in accordance with the embodiment 8. The circuit diagram and appearance perspective view of this semiconductor device 108 are identical to those of FIG. 1 and FIG. 2 of the embodiment 1, and FIG. 17 is a sectional view taken along line X—X in FIG. 2 in which the semiconductor device 101 is replaced by the semiconductor device 108.

The semiconductor device 108 is typically distinct from the semiconductor device 101 of the embodiment 1 in the following points: each of wiring patterns 26, 27 is divided in correspondence to respective IGBTs 3, and all the emitter pads 34 of each IGBT 3 are connected to the corresponding wiring pattern 26 or 27 through any one of a plurality of conductive wires W1 to W4. For example, ends of six conductor wires W1 are respectively connected to all the six emitter pads 34 that are installed in one (IGBT 3 positioned on the left end of FIG. 17) of two IGBTs belonging to the upper arm 10, and the other ends of the conductor wires W1 are connected to the wiring pattern 26.

A plurality of conductor wires 15, which connect the emitter electrodes of each IGBT 3 to the wiring pattern 22 or 23, are connected to all the emitter pads 34 belonging to each IGBT 3. For this reason, as described earlier, hardly any current is allowed to flow the bridging portions 35 of FIG. 16 in the normal operation of the semiconductor device 108. In the example of FIG. 17, one end of each of the two conductor wires 15 is connected to each of the emitter pads 34 of each IGBT 3, and the other end thereof is connected to the wiring pattern 22 or 23. The arrangement in which each of the emitter pads 34 of each IGBT 3 is connected to the wiring pattern 22 or 23 through the two conductor wires 15 is the same as those arrangements shown in the respective Figures of the semiconductor devices 101 to 107 in accordance with the embodiments 1 to 7, and is also the same as those arrangements shown in the respective Figures of semiconductor devices 109 to 115 in accordance with the following embodiments 9 to 15, except for the embodiments 16 and 17.

As described above, in the semiconductor device 108, all the emitter pads 34 in each IGBT 3 are electrically connected to each other through any one of the conductor wires W1 to W4 and either the wiring pattern 26 or 27, which are conductors that do not pass through the wiring pattern 22 or 23, that is, conductors through which no emitter current is allowed to flow. For this reason, electric potentials are uniformed among the emitter pads 34. Consequently, even in the event of short-circuiting in the load of the semiconductor device 108, that is, even in the event of an excessive short-circuiting current flowing through each IGBT 3, it is possible to suppress the oscillating phenomenon in the potential of the gate electrode of each IGBT 3.

In the example shown in FIG. 17, any one of the conductor wires W1 to W4 is connected to each of the emitter pads 34 of each IGBT 3 one by one; however, in general, not less than one of them may be connected. None the less, the arrangement of FIG. 17 in which the connection is made one by one makes it possible to minimize the number of the conductor wires W1 to W4, to allow easy connection of the conductor wires W1 to W4, and also to effectively suppress the oscillation in each IGBT 3.

Moreover, in the semiconductor device 108, the emitter pads 34 of each IGBT 3 are aligned along one direction, and the corresponding wiring pattern 22 or 23 and wiring pattern 26 or 27 are placed in a manner so as to oppose each other with the corresponding IGBT 3 interpolated in between, and also extend along the arranging direction of the emitter pads 34. For this reason, the conductor wire 15 and the conductor wires W1 to W4 are easily assembled without any interference against each other. Moreover, the inductive coupling between the conductor wires 15 and the conductor wires W1 to W4 is lowered so that it is possible to increase the effect for suppressing the oscillation.

In the semiconductor device 108, the respective wiring patterns 26 and 27 are placed adjacent to the corresponding IGBTs 3 without sandwiching the other wiring pattern. For this reason, it becomes possible to shorten the conductor wires W1 to W4. Consequently, the inductance of the conductor for electrically connecting the emitter pads 34 is reduced so that the electric potentials are uniformed more effectively among the emitter pads 34. Moreover, since each of the wiring patterns 26 and 27 is divided in correspondence to respective IGBTs 3, the IGBTs 3 are less susceptible to limitations in their layout.

Here, with respect to the semiconductor device 108, the present embodiment has exemplified a case in which each of the upper arm 10 and the lower arm 11 is provided with two IGBTs 3 that are parallel-connected to each other; however, not less than three IGBTs 3 that are parallel-connected one after another may be installed, or only the single IGBT 3 may be installed. In either of these cases, all the emitter pads 34 in each of the IGBTs 3 are electrically connected to each other through conductors that do not pass through the wiring pattern 22 or 23; therefore, it is possible to suppress the oscillation of the IGBT 3.

Embodiment 9

Figure 18:
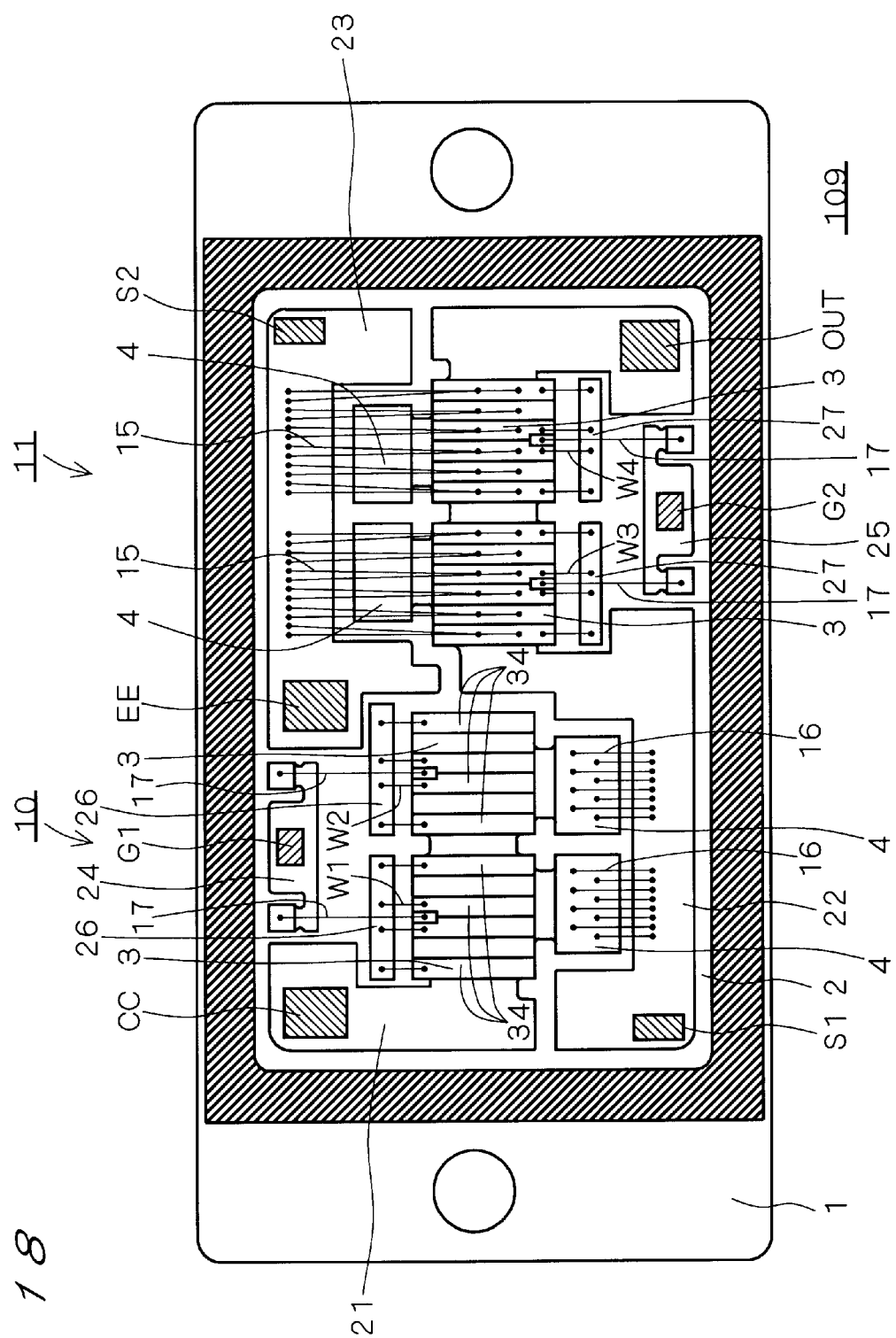
FIG. 18 is a plan sectional view that shows a device in accordance with an embodiment 9.

FIG. 18 is a plan sectional view of a semiconductor device in accordance with the embodiment 9. The circuit diagram and appearance perspective view of this semiconductor device 109 are identical to those of FIG. 1 and FIG. 2 of the embodiment 1, and FIG. 18 is a sectional view taken along line X—X in FIG. 2 in which the semiconductor device 101 is replaced by the semiconductor device 109.

The semiconductor device 109 is typically distinct from the semiconductor device 108 of the embodiment 8 in that the conductor wires W1 to W4 are connected to only the not less than two (four in the example of FIG. 18) emitter pads 34, which form a portion of a plurality of emitter pads 34 belonging to each of IGBTs 3. For example, ends of four conductor wires W1 are respectively connected to only the four emitter pads 34 among six emitter pads 34 installed in one (the IGBT 3 located on the left end of FIG. 17) of two IGBTs belonging to the upper arm 10, and the other ends of the conductor wires W1 are connected to the wiring pattern 26.

In the semiconductor device 109, the emitter pads 34, which form the portion (not less than two) of a plurality of emitter pads 34 belonging to each of the IGBT 3, are electrically connected to each other by conductors (that is, any one of the conductor wires W1 to W4 and any one of the patterns 26 and 27) that do not pass through the wiring patterns 22 and 23 respectively; therefore, the corresponding effect for suppressing the oscillation even in the event of short-circuiting in the IGBT 3 is obtained. Moreover, the gap between the conductor wires W1 to W4 is maintained wider so that the connection of the conductor wires W1 to W4 is easily carried out.

The ratio of the emitter pads 34 to which any of the conductor wires W1 to W4 are connected among the plurality of emitter pads 34 belonging to each of the IGBTs 3 is preferably set to not less than ½ (not less than three in the example of the IGBT 3 in FIG. 18). This is because the ratio of not less than ½ makes it possible to obtain the effect for suppressing the oscillation notably.

Embodiment 10

Figure 19:
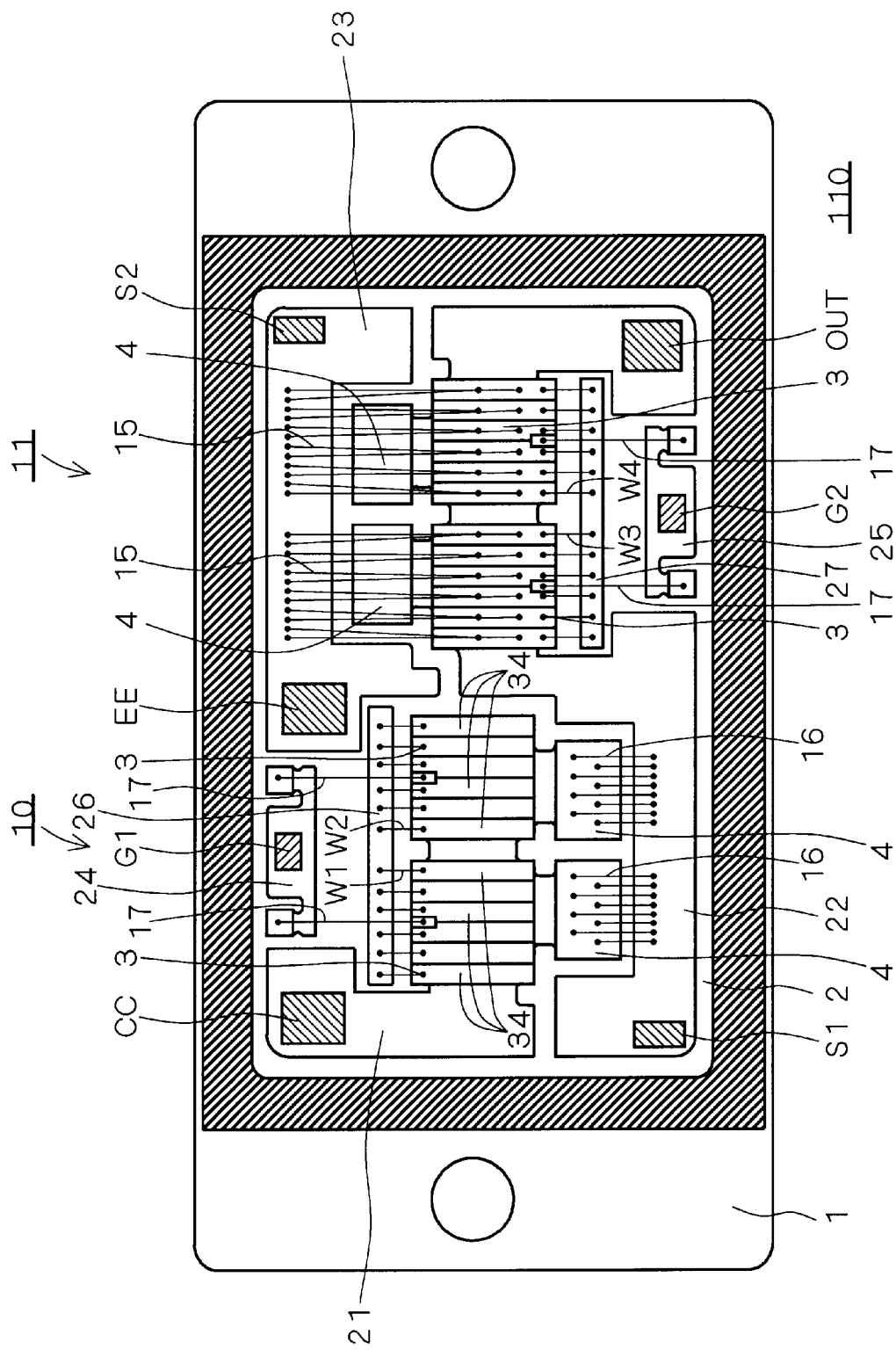
FIG. 19 is a plan sectional view that shows a device in accordance with an embodiment 10.

FIG. 19 is a plan sectional view of a semiconductor device in accordance with the embodiment 10. The circuit diagram and appearance perspective view of this semiconductor device 110 are identical to those of FIG. 1 and FIG. 2 of the embodiment 1, and FIG. 19 is a sectional view taken along line X—X in FIG. 2 in which the semiconductor device 101 is replaced by the semiconductor device 110.

The semiconductor device 110 is typically distinct from the semiconductor device 108 of the embodiment 8 in that, in each of the upper arm 10 and the lower arm 11, the wiring pattern 26 or 27 that is associated with not less than two (two in the example of FIG. 19) IGBTs 3 that are parallel-connected, is not divided in correspondence to respective IGBTs 3, and is integrally coupled. For this reason, in each of the IGBTs 3, the emitter pads 34 are connected to each other through any one of the conductor wires W1 to W4 and either one of the wiring patterns 26, 27, and between the IGBTs 3 that are connected in parallel as well, the emitter pads 34 are connected to each other through those conductors. Consequently, in comparison with the semiconductor device 108 in the embodiment 8, it is possible to further increase the effect for suppressing the oscillation of each IGBT 3.

Moreover, in the semiconductor device 110, the respective IGBTs 3 are arranged in a manner so as to align the emitter pads of the IGBTs 3 parallel-connected to each other along one direction, with the wiring patterns 26 and 27 being extended along the aligning direction of the corresponding emitter pads 34. Thus, it is possible to easily assemble the conductor wires W1 to W4.

Embodiment 11

Figure 20:
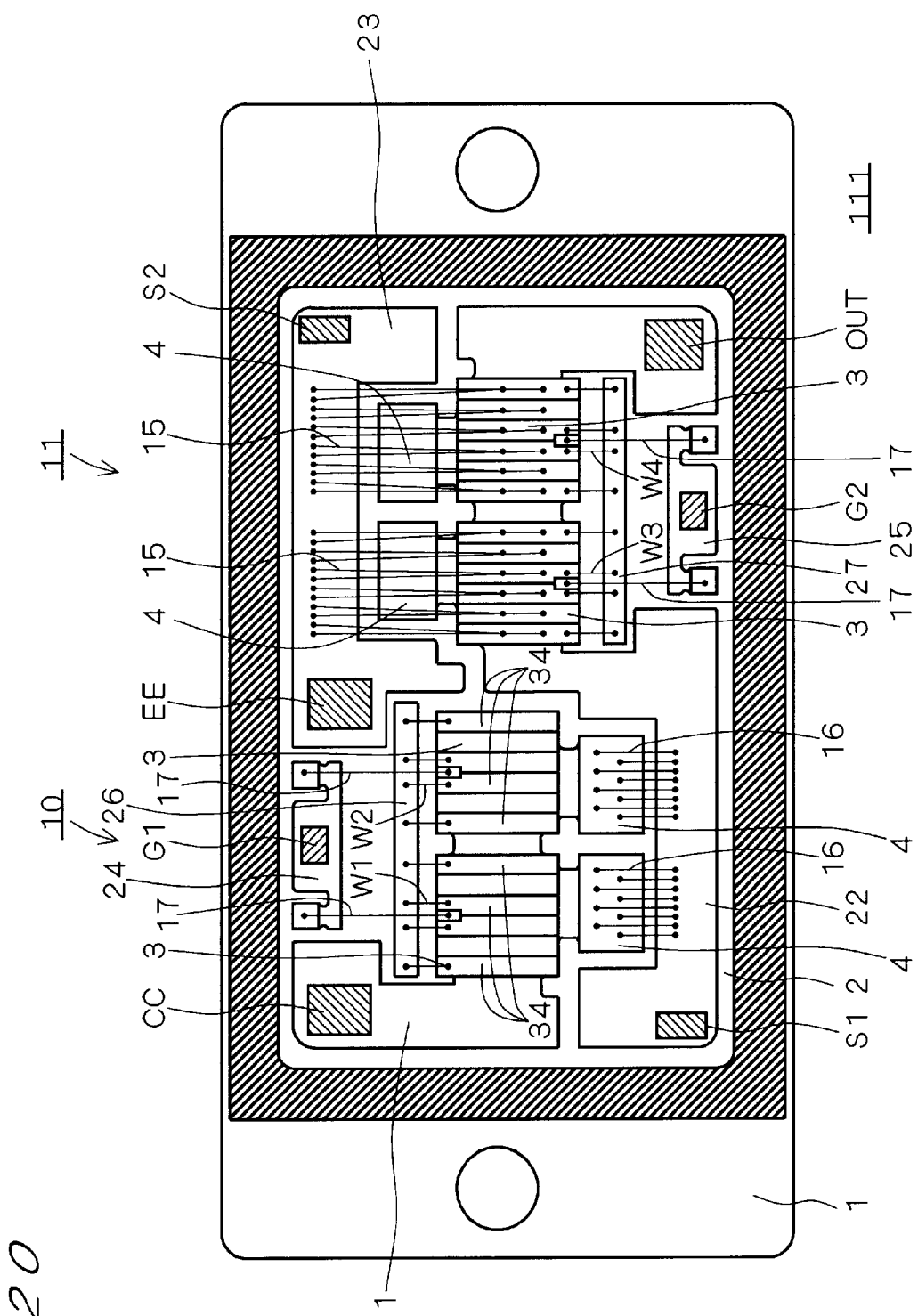
FIG. 20 is a plan sectional view that shows a device in accordance with an embodiment 11.

FIG. 20 is a plan sectional view of a semiconductor device in accordance with the embodiment 11. The circuit diagram and appearance perspective view of this semiconductor device 111 are identical to those of FIG. 1 and FIG. 2 of the embodiment 1, and FIG. 20 is a sectional view taken along line X—X in FIG. 2 in which the semiconductor device 101 is replaced by the semiconductor device 111.

The semiconductor device 111 is typically distinct from the semiconductor device 109 of the embodiment 9 in that, in each of the upper arm 10 and the lower arm 11, the wiring pattern 26 or 27 that is associated with not less than two (two in the example of FIG. 19) IGBTs 3 that are parallel-connected, is not divided in correspondence to respective IGBTs 3, and is integrally coupled. For this reason, in each of the IGBTs 3, the emitter pads 34 are connected to each other through any one of the conductor wires W1 to W4 and either one of the wiring patterns 26, 27, and between the IGBTs 3 that are parallel connected as well, the emitter pads 34 are partly connected to each other through those conductors. Consequently, in comparison with the semiconductor device 109 in the embodiment 9, it is possible to further increase the effect for suppressing the oscillation of each IGBT 3. Moreover, the present semiconductor device is same as the semiconductor device 109 of the embodiment 9 in that the ratio of the emitter pads 34 to which any of the conductor wires W1 to W4 are connected among the plurality of emitter pads 34 belonging to each of the IGBTs 3 is preferably set to not less than ½.

In the semiconductor device 111, among the plurality of emitter pads 34 belonging to each of the IGBTs 3, not less than two emitter pads 34 to which any of the conductor wires W1 to W4 are connected are assigned in a comparatively uniformed manner. In the example of FIG. 20 the four emitter pads 34 to which any of the conductor wires W1 to W4 are connected are assigned to both of the end portions and the center portion. The same is also true for the semiconductor device 109 (FIG. 18). With this arrangement, since the electric potentials are uniformed more effectively among the emitter pads 34 belonging to each IGBT 3, it is possible to suppress the oscillation more effectively.

Figure 21:
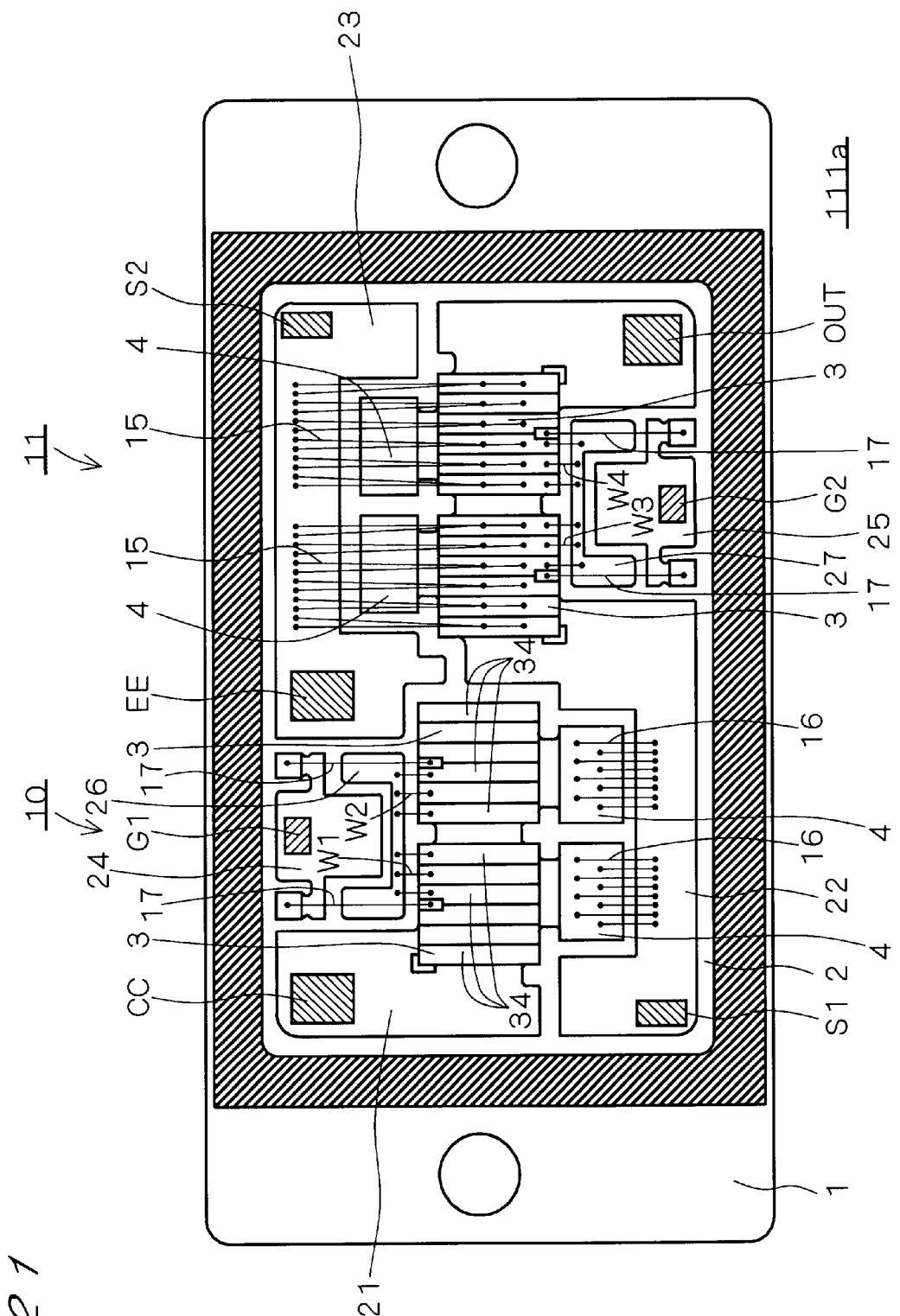
FIG. 21 is a plan sectional view that shows another example of the device in accordance with the embodiment 11.

Here, as indicated by a semiconductor device 111a in FIG. 21, between the IGBTs that are parallel-connected and adjacent to each other, any of the conductor wires W1 to W4 may be connected to the emitter pads 34 that are placed closest to each other. In the example of FIG. 21, any of the conductor wires W1 to W4 are connected to three emitter pads 34; however, in general, any one of the conductor wires W1 to W4 may be connected to one emitter pad 34. In the case when not less than three IGBTs 3 are parallel-connected to each other, with respect to the IGBTs 3 except for the IGBTs 3 located on both of the ends, any of the conductor wires W1 to W4 are connected to at least two emitter pads 34 including those emitter pads 34 located at both of the ends.

In the semiconductor device 111a also, in each of the IGBTs 3, the emitter pads 34 are partly connected to each other through any one of the conductor wires W1 to W4 and either one of the wiring patterns 26, 27, and between the IGBTs 3 that are connected in parallel as well, the emitter pads 34 are partly connected to each other through those conductors. Consequently, the corresponding effect for suppressing the oscillation of each IGBT 3 is obtained. In particular, it is possible to reduce the length of the wiring pattern 26 or 27 along the aligning direction of the plurality of IGBTs 3 that are connected in parallel to each other. This makes it possible to miniaturize the semiconductor device 111a.

Here, in the semiconductor device 111a also, in the same manner as the semiconductor devices 109, 111, the ratio of the emitter pads 34 to which any of the conductor wires W1 to W4 are connected among the plurality of emitter pads 34 belonging to each of the IGBTs 3 is preferably set to not less than ½. In the example shown in FIG. 21, the ratio is set to ½.

Embodiment 12

Figure 22:
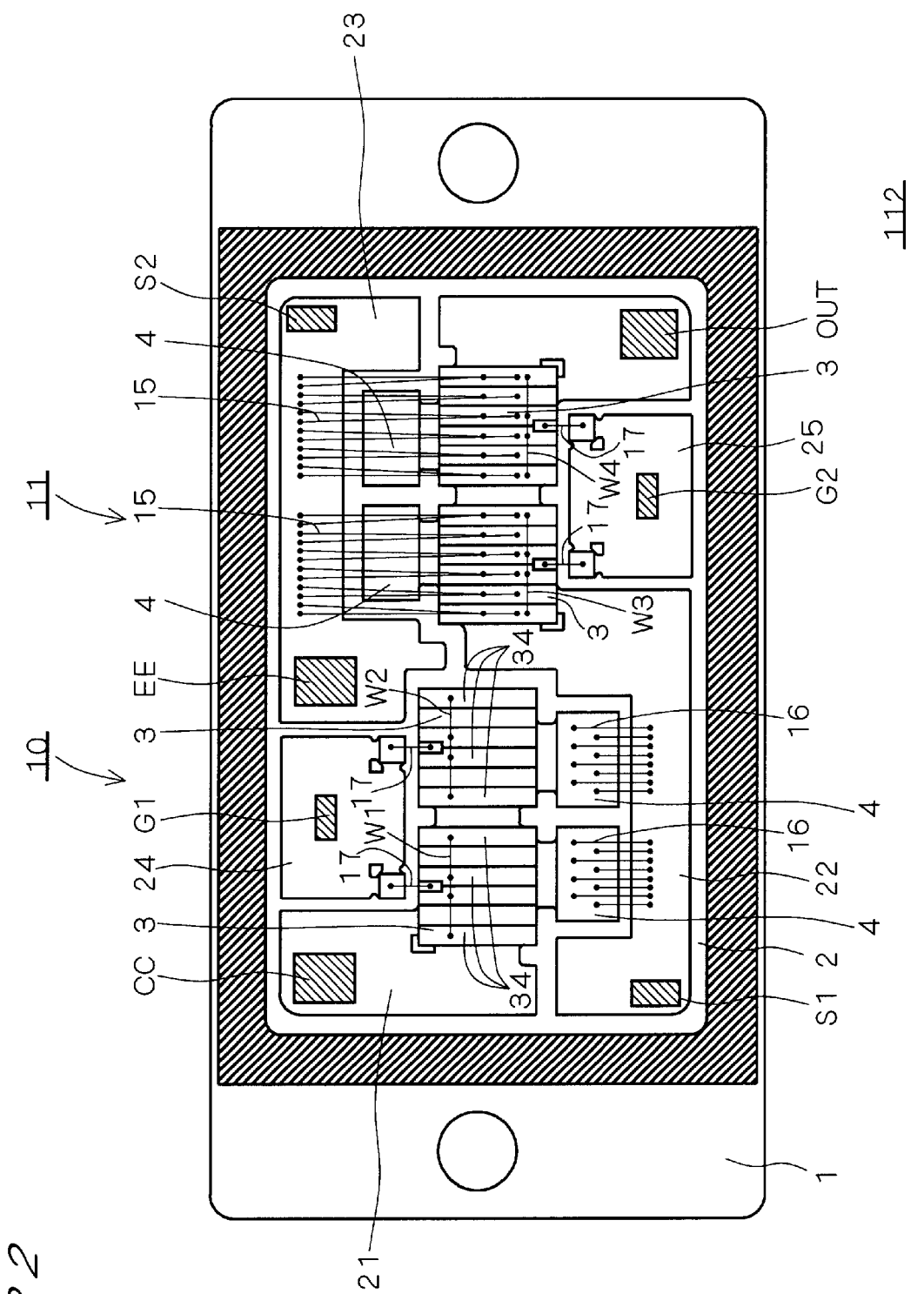
FIG. 22 is a plan sectional view that shows a device in accordance with an embodiment 12.

FIG. 22 is a plan sectional view of a semiconductor device in accordance with the embodiment 12. The circuit diagram and appearance perspective view of this semiconductor device 112 are identical to those of FIG. 1 and FIG. 2 of the embodiment 1, and FIG. 22 is a sectional view taken along line X—X in FIG. 2 in which the semiconductor device 101 is replaced by the semiconductor device 112.

The semiconductor device 112 is typically distinct from the semiconductor device 109 of the embodiment 9 in that, no wiring patterns 26, 27 are installed, and in that not less than two (four in the example of FIG. 22) emitter pads 34 that form a portion of a plurality of emitter pads 34 belonging to each of the IGBTs 3 are directly connected to each other by any of the conductor wires W1 to W4. In the semiconductor device 112 also, in the same manner as the semiconductor device 109, the emitter pads 34, which form the portion (not less than two in this case) of a plurality of emitter pads 34 belonging to each of the IGBT 3, are electrically connected to each other by conductors (that is, any one of the conductor wires W1 to W4) that do not pass through the wiring patterns 22 and 23 respectively; therefore, the corresponding effect for suppressing the oscillation even in the event of short-circuiting in the IGBT 3 is obtained. Moreover, in the same manner as the semiconductor device 109 of the embodiment 9, the ratio of the emitter pads 34 to which any of the conductor wires W1 to W4 are connected among the plurality of emitter pads 34 belonging to each of the IGBTs 3 is preferably set to not less than ½.

In the semiconductor device 112, since no wiring patterns 26, 27 are required, it is possible to make the manufacturing process easier, to reduce the area of the substrate 2 and also to miniaturize the semiconductor device 112. Moreover, since the respective conductor wires W1 to W4 are connected to those emitter pads forming the portion of a plurality of emitter pads 34 belonging to each of the IGBTs 3, it is possible to easily connect the conductor wires W1 to W4 to the emitter pads 34 even in the case when the width of each emitter pad 34 is narrow.

Moreover, as illustrated in FIG. 22, each of the conductor wires W1 to W4 is arranged along the aligning direction of the emitter pads 34 of each IGBT 3. Consequently, the conductor wires W1 to W4 and the conductor wires 15 are made virtually orthogonal to each other. With this arrangement, the inductive coupling between the conductor wire 15 and the conductor wires W1 to W4 is lowered so that it is possible to increase the effect for suppressing the oscillation.

Moreover, as to the respective IGBTs 3, the conductive wires W1 to W4 are connected to not less than two emitter pads 34 at portions far apart from the wiring pattern 22 or 23 than ends of the conductor wires 15. For this reason, the inductive coupling between the conductor wires 15 and the conductor wires W1 to W4 is lowered so that it is possible to further increase the effect for suppressing the oscillation. Moreover, the conductor wires 15 and the conductor wires W1 to W4 are easily installed without any interference.

Here, FIG. 22 has exemplified a case in which two IGBTs 3 are parallel-connected; however, not less than three IGBTs 3 may be connected in parallel. Moreover, only a single IGBT 3 may be installed in each of the upper arm 10 and the lower arm 11. In either of the cases, emitter pads 34 forming the portion of a plurality of emitter pads 34 of each IGBT 3 are electrically connected to each other through conductors that do not pass through the wiring pattern 22 or 23; therefore, the corresponding effect for reducing the oscillation of each IGBT 3 is obtained.

Embodiment 13

Figure 23:
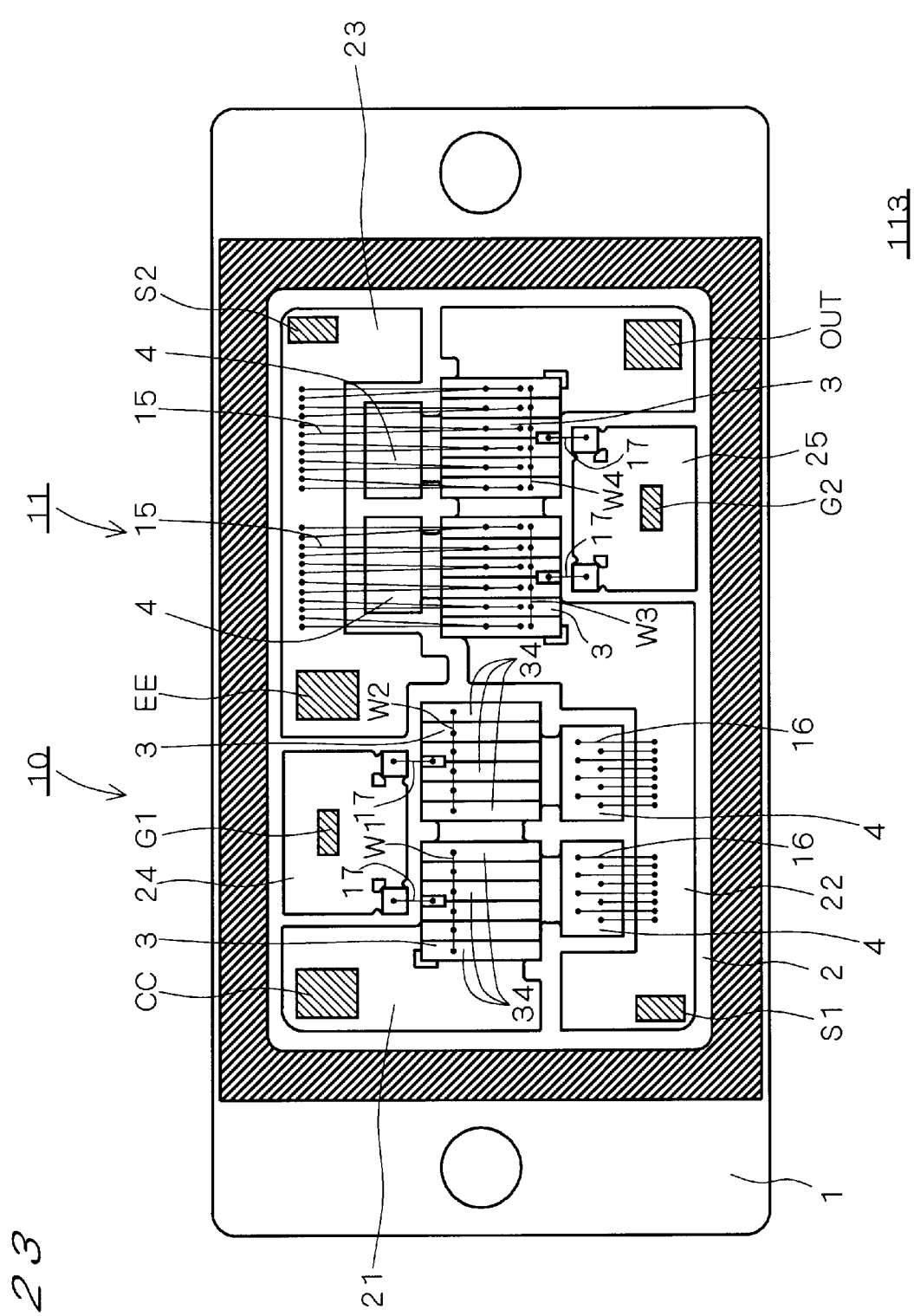
FIG. 23 is a plan sectional view that shows a device in accordance with an embodiment 13.

FIG. 23 is a plan sectional view of a semiconductor device in accordance with the embodiment 13. The circuit diagram and appearance perspective view of this semiconductor device 113 are identical to those of FIG. 1 and FIG. 2 of the embodiment 1, and FIG. 23 is a sectional view taken along line X—X in FIG. 2 in which the semiconductor device 101 is replaced by the semiconductor device 113.

The semiconductor device 113 is typically distinct from the semiconductor device 112 of the embodiment 12 in that all the emitter pads 34 belonging to each of the IGBTs 3 are connected to any of the conductor wires W1 to W4. Therefore, it is possible to more effectively suppress the oscillation of each IGBT 3.

Embodiment 14

Figure 24:
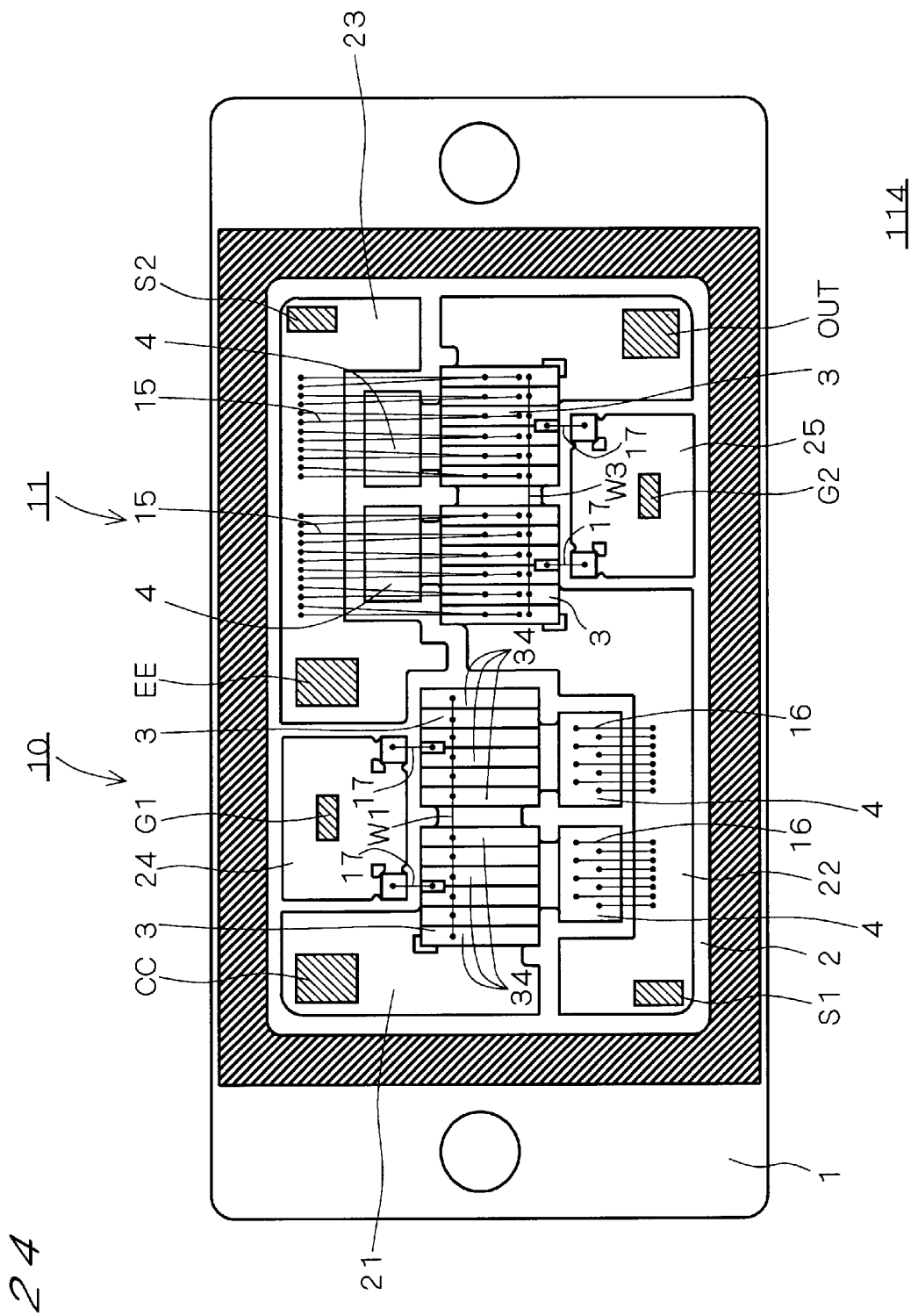
FIG. 24 is a plan sectional view that shows a device in accordance with an embodiment 14.

FIG. 24 is a plan sectional view of a semiconductor device in accordance with the embodiment 14. The circuit diagram and appearance perspective view of this semiconductor device 114 are identical to those of FIG. 1 and FIG. 2 of the embodiment 1, and FIG. 24 is a sectional view taken along line X—X in FIG. 2 in which the semiconductor device 101 is replaced by the semiconductor device 114.

The semiconductor device 114 is typically distinct from the semiconductor device 113 of the embodiment 13 not only in that all the emitter pads 34 are connected to either of the conductor wire W1 or W3, but also in that between the not less than two (two in the example of FIG. 25) IGBTs 3 that are parallel-connected each other, the emitter pads 34 are connected to each other through the conductor wire W1 or W3. Consequently, in comparison with the semiconductor device 113 in the embodiment 13, the semiconductor device 114 makes it possible to further increase the effect for suppressing the oscillation of each IGBT 3. Moreover, between the not less than two IGBTs 3 that are parallel-connected to each other, all the emitter pads 34 are aligned in one direction so that the conductor wires W1 and W3 are easily installed along that one direction.

Embodiment 15

Figure 25:
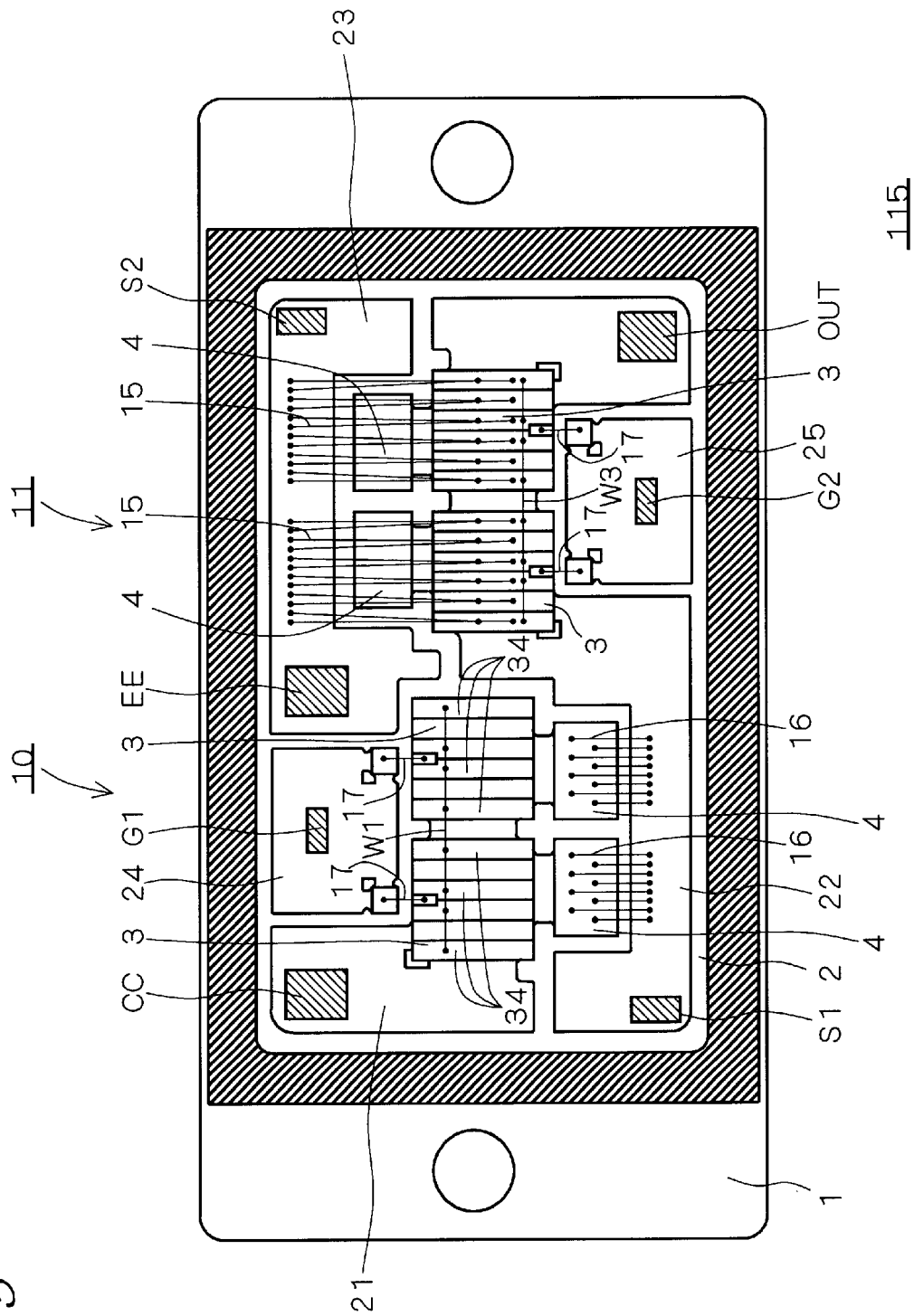
FIG. 25 is a plan sectional view that shows a device in accordance with an embodiment 15.

FIG. 25 is a plan sectional view of a semiconductor device in accordance with the embodiment 15. The circuit diagram and appearance perspective view of this semiconductor device 115 are identical to those of FIG. 1 and FIG. 2 of the embodiment 1, and FIG. 25 is a sectional view taken along line X—X in FIG. 2 in which the semiconductor device 101 is replaced by the semiconductor device 115.

The semiconductor device 115 is typically distinct from the semiconductor device 112 of the embodiment 12 not only in that emitter pads forming a portion of emitter pads 34 are connected to each other by the conductor wire W1 or W3, but also in that between the not less than two (two in the example of FIG. 25) IGBTs 3 that are parallel-connected each other, the emitter pads 34 are connected to each other through the conductor wire W1 or W3. Consequently, in comparison with the semiconductor device 112 in the embodiment 12, it becomes possible to further increase the effect for suppressing the oscillation of each IGBT 3.

Embodiment 16

Figure 26:
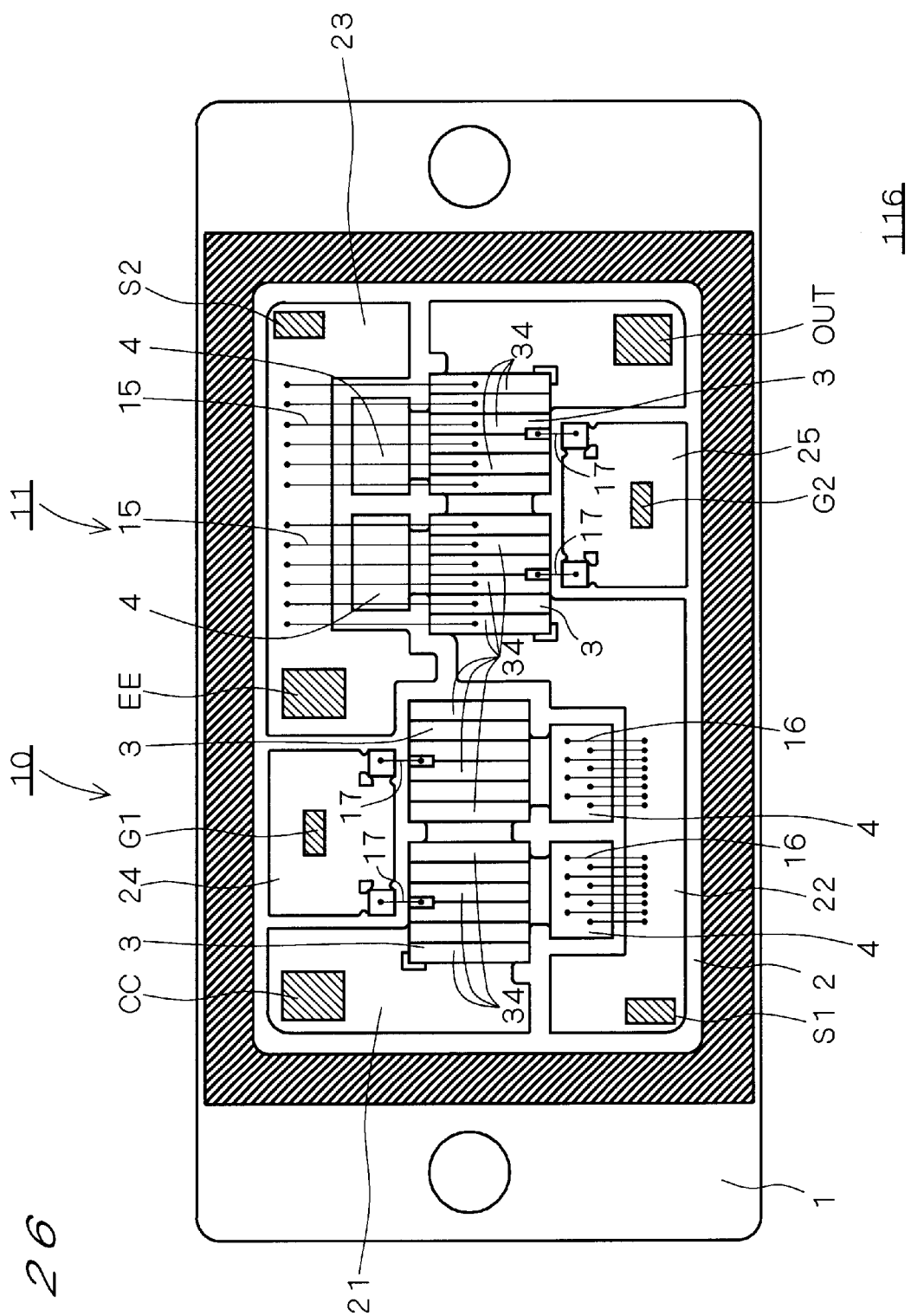
FIG. 26 is a plan sectional view that shows a device in accordance with an embodiment 16.

FIG. 26 is a plan sectional view of a semiconductor device in accordance with the embodiment 16. The circuit diagram and appearance perspective view of this semiconductor device 116 are identical to those of FIG. 1 and FIG. 2 of the embodiment 1, and FIG. 26 is a sectional view taken along line X—X in FIG. 2 in which the semiconductor device 101 is replaced by the semiconductor device 116.

The semiconductor device 116 is typically distinct from the conventional semiconductor device 150 in that each of a plurality of emitter pads 34 belonging to each of the IGBTs is connected to the wiring pattern 22 or 23 through only one conductor wire 15. For this reason, even in the event of short-circuiting in the load of the semiconductor device 116 and the subsequent excessive short-circuiting current flowing through each IGBT 3, the magnitude of the emitter current flowing through each IGBT 3 is limited by the resistance of the conductor wire 15; therefore, it is possible to suppress the oscillating phenomenon in the potential of the gate electrode of each IGBT 3. Moreover, since the emitter pads 34 of each of the IGBTs 3 are aligned along one direction and since the corresponding wiring pattern 22 or 23 is extended along the above-mentioned one direction, the plurality of conductor wires 15 are easily assembled without any interference against each other.

Embodiment 17

Figure 27:
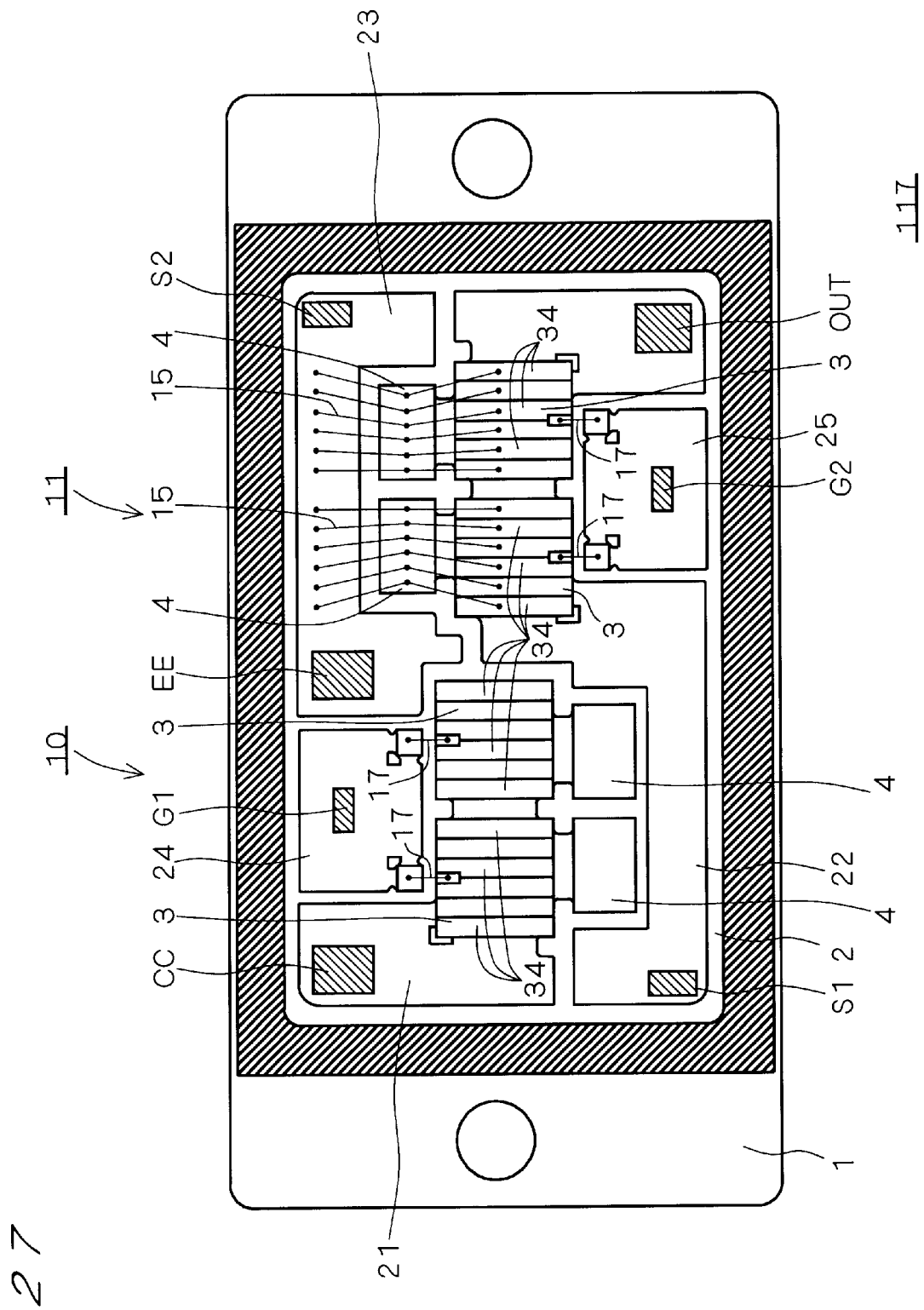
FIG. 27 is a plan sectional view that shows a device in accordance with an embodiment 17.

FIG. 27 is a plan sectional view of a semiconductor device in accordance with the embodiment 17. The circuit diagram and appearance perspective view of this semiconductor device 117 are identical to those of FIG. 1 and FIG. 2 of the embodiment 1, and FIG. 27 is a sectional view taken along line X—X in FIG. 2 in which the semiconductor device 101 is replaced by the semiconductor device 117.

The semiconductor device 117 is typically distinct from the semiconductor device 116 of the embodiment 16 in that a middle portion of each conductor wire 15 connected to each of the IGBTs 3 is connected to the anode of the corresponding diode 4. With this arrangement, the semiconductor device 117 eliminates the necessity of installing any conductor wire for connecting the corresponding IGBT 3 and diode 4 in a separated manner. In other words, by reducing the number of conductor wires in the entire construction of the semiconductor device 117, it is possible to reduce the number of manufacturing processes and the production costs.

Modifications (1) The above-mentioned embodiments have exemplified cases in which a semiconductor device is provided with IGBTs 3; however, not limited to this, the present invention is widely applicable to a semiconductor device which is provided with a switching element having a pair of main electrodes through which a main current (for example, an emitter current, a drain current, etc.) flows and a control electrode for receiving a driving signal and for controlling the main current in response to the driving signal. The switching element may be constituted by, for example, MOSFETs or bipolar transistors. In a general switching element, a gate wire 32 is extended to a control electrode wire, a gate pad 33 is extended to a bonding pad of a control electrode, and an emitter pad 34 is extended to a bonding pad of a main electrode.

Each of the semiconductor devices 101 to 107 according to the embodiments can be widely utilized for an applied apparatus controlling a large current through such advantages of insulated gate switching elements e.g. IGBTs 3 that the same are easy to control although the same are naturally easy to cause oscillation and oscillation thereof can be suppressed. Further, insulated gate switching elements have high necessity for protection of gate insulator films, and hence the present invention is particularly useful for the device having insulated gate switching elements also in this sense.

(2) When some conductor electrically conducting emitter electrodes (generally main electrodes) of a plurality of IGBTs 3 (generally a plurality of switching elements) without through a wiring pattern 22 (or 23) fed with an emitter current (generally a main current) is provided in general, uniformity of the potentials of emitter electrodes (generally main electrodes) can be improved thereby suppressing oscillation. The wiring pattern 26 (or 27) and the conductor wires W1 and W2 (or W3 and W4) correspond to the conductor in each of the semiconductor devices 101 and 102, while the conductor wire W5 (or W6) corresponds to the conductor in the semiconductor device 103.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a substrate having a main surface;

a first wiring pattern arranged on said main surface;

a plurality of switching elements arranged on said first wiring pattern so that first main electrodes thereof are electrically connected with each other;

a second wiring pattern arranged on said main surface;

a plurality of first conductor wires having first ends connected to second main electrodes of said plurality of switching elements and second ends connected to said second wiring pattern;

an external terminal connected to said second wiring pattern for electrically connecting said second main electrodes of said plurality of switching elements with the exterior through said second wiring pattern; and a conductor electrically connecting said second main electrodes of said plurality of switching elements with each other without through said second wiring pattern.

2. The semiconductor device according to claim 1, wherein said conductor includes:

a third wiring pattern arranged on said main surface isolatedly from said second wiring pattern, and a plurality of second conductor wires having first ends connected to said second main electrodes of said plurality of switching elements and second ends connected to said third wiring pattern.

3. The semiconductor device according to claim 2, wherein said second wiring pattern extends along the direction of arrangement of said plurality of switching elements, and said third wiring pattern extends along the direction of arrangement of said plurality of switching elements on the side opposite to said second wiring pattern through said plurality of switching elements.

4. The semiconductor device according to claim 3, wherein said third wiring pattern is adjacent to said plurality of switching elements without the remaining wiring patterns interposed therebetween.

5. The semiconductor device according to claim 2, wherein said third wiring pattern has a repetitive bent portion.

6. The semiconductor device according to claim 1, wherein said conductor includes:

a third conductor wire directly connecting said second main electrodes of said plurality of switching elements with each other.

7. The semiconductor device according to claim 6, wherein said second wiring pattern extends along the direction of arrangement of said plurality of switching elements, said plurality of first conductor wires are arranged in a direction substantially perpendicular to said direction of arrangement, and said third conductor wire is arranged along said direction of arrangement.

8. The semiconductor device according to claim 7, wherein said third conductor wire is connected with said second main electrodes of said plurality of switching elements on portions farther from said second wiring pattern than said first ends of said plurality of first conductor wires.

9. The semiconductor device according to claim 2, further comprising:

a fourth wiring pattern arranged on said main surface, a plurality of fourth conductor wires having first ends connected to control electrodes of said plurality of switching elements and second ends connected to said fourth wiring pattern, and a voltage clamping element having a first end connected to said third wiring pattern and a second end connected to said fourth wiring pattern.

10. A semiconductor device comprising:

a substrate having a main surface;

a first wiring pattern arranged on said main surface;

a plurality of switching elements arranged on said first wiring pattern so that first main electrodes thereof are electrically connected with each other;

a second wiring pattern arranged on said main surface;

a plurality of first conductor wires having first ends connected to second main electrodes of said plurality of switching elements and second ends connected to said second wiring pattern;

an external terminal connected to said second wiring pattern for electrically connecting said second main electrodes of said plurality of switching elements with the exterior through said second wiring pattern; and a voltage clamping element electrically connected between control electrodes and said second main electrodes of said plurality of switching elements.

11. A semiconductor device comprising:

a substrate having a main surface;

a first wiring pattern arranged on said main surface;

a plurality of switching elements arranged on said first wiring pattern so that first main electrodes are electrically connected with each other;

a second wiring pattern arranged on said main surface to extend along the direction of arrangement of said plurality of switching elements;

a plurality of first conductor wires having first ends connected to second main electrodes thereof of said plurality of switching elements and second ends connected to said second wiring pattern;

an external terminal connected to said second wiring pattern for electrically connecting said second main electrodes of said plurality of switching elements with the exterior through said second wiring pattern;

a plurality of diodes, provided in the same number as said plurality of switching elements, arranged on said first wiring pattern so that first electrodes thereof are electrically connected with each other and arranged between said plurality of switching elements and said second wiring pattern to be adjacent to said plurality of switching elements in one-to-one correspondence;

a plurality of second conductor wires having first ends connected to second electrodes of said plurality of diodes and second ends connected to said second wiring pattern; and a plurality of third conductor wires having first ends connected to said second main electrodes of said plurality of switching elements, intermediate potions connected to said second electrodes of at least part of said plurality of diodes and second ends connected to said second wiring pattern thereby electrically connecting all said second main electrodes of said plurality of switching elements with each other without through said second wiring pattern.

12. The semiconductor device according to claim 1, wherein said second wiring pattern extends along the direction of arrangement of said plurality of switching elements, said second wiring pattern is formed with a slit extending along said direction of arrangement so as to leave a coupling portion on the side of a first end of said direction of arrangement while as to leave no coupling portion on the side of a second end, said second ends of said plurality of first conductor wires are connected to said second wiring pattern on a first portion closer to said plurality of switching elements than said slit, and said external terminal is connected to said second wiring pattern on said coupling portion on the side of said first end, said semiconductor device further comprising:
another external terminal connected to said second wiring pattern on the side of said second end in a second portion farther from said plurality of switching elements than said slit for electrically connecting said second main electrodes of said plurality of switching elements with the exterior through said second wiring pattern.

13. The semiconductor device according to claim 10, wherein said second wiring pattern extends along the direction of arrangement of said plurality of switching elements, said second wiring pattern is formed with a slit extending along said direction of arrangement so as to leave a coupling portion on the side of a first end of said direction of arrangement while as to leave no coupling portion on the side of a second end, said second ends of said plurality of first conductor wires are connected to said second wiring pattern on a first portion closer to said plurality of switching elements than said slit, and said external terminal is connected to said second wiring pattern on said coupling portion on the side of said first end, said semiconductor device further comprising:
another external terminal connected to said second wiring pattern on the side of said second end in a second portion farther from said plurality of switching elements than said slit for electrically connecting said second main electrodes of said plurality of switching elements with the exterior through said second wiring pattern.

14. The semiconductor device according to claim 11, wherein said second wiring pattern extends along the direction of arrangement of said plurality of switching elements, said second wiring pattern is formed with a slit extending along said direction of arrangement so as to leave a coupling portion on the side of a first end of said direction of arrangement while as to leave no coupling portion on the side of a second end, said second ends of said plurality of first conductor wires are connected to said second wiring pattern on a first portion closer to said plurality of switching elements than said slit, and said external terminal is connected to said second wiring pattern on said coupling portion on the side of said first end, said semiconductor device further comprising:
another external terminal connected to said second wiring pattern on the side of said second end in a second portion farther from said plurality of switching elements than said slit for electrically connecting said second main electrodes of said plurality of switching elements with the exterior through said second wiring pattern.

15. The semiconductor device according to claim 12, further comprising:

a fifth conductor wire having a first end connected to said first portion and a second end connected to said second portion.

16. The semiconductor device according to claim 1, wherein each of said plurality of switching elements is an insulated gate switching element.

17. The semiconductor device according to claim 10, wherein each of said plurality of switching elements is an insulated gate switching element.

18. The semiconductor device according to claim 11, wherein each of said plurality of switching elements is an insulated gate switching element.

* * * * *